United States Patent [19]

Gorin et al.

[11] Patent Number: 5,020,059
[45] Date of Patent: May 28, 1991

[54] RECONFIGURABLE SIGNAL PROCESSOR

[75] Inventors: Allen L. Gorin, Fair Lawn; Patrick A. Makofsky, Randolph; Nancy Morton, Dover; Neal C. Oliver, Madison; Richard R. Shively, Convent Station, all of N.J.; Christopher A. Stanziola, Hyde Park, N.Y.

[73] Assignee: AT&T Bell Laboratories, Murray Hill, N.J.

[21] Appl. No.: 331,411

[22] Filed: Mar. 31, 1989

[51] Int. Cl.[5] ............................................. G06F 11/18
[52] U.S. Cl. .................................. 371/11.3; 364/200; 364/268.9; 364/281.9
[58] Field of Search ..................... 371/11.1, 11.3, 9.1; 364/200 MS File, 900 MS File

[56] References Cited

U.S. PATENT DOCUMENTS

| | | | |
|---|---|---|---|
| 3,959,638 | 5/1976 | Blum et al. | 371/11.3 |
| 4,314,349 | 2/1982 | Batcher | 371/11.3 |
| 4,503,535 | 3/1985 | Budde et al. | 371/11.3 |
| 4,698,807 | 10/1987 | Marwood et al. | 371/11.3 |
| 4,860,201 | 8/1989 | Stolfo et al. | 364/200 |
| 4,868,818 | 9/1989 | Madan et al. | 371/11.3 |
| 4,907,232 | 3/1990 | Harper et al. | 371/11.3 |

*Primary Examiner*—Charles E. Atkinson
*Attorney, Agent, or Firm*—Charles E. Graves

[57] ABSTRACT

An interconnection scheme among the processing elements ("PEs") of a multiprocessor computing architecture realizes, through PE reconfiguration, both fault tolerance and a wide variety of different processing topologies including binary trees and linear systolic arrays. By using a novel variant on a tree expansion scheme, the invention also allows for arbitrary up-sizing of the PE count to build virtually any size of tree network, with each size exhibiting same high degree of fault tolerance and reconfigurability. The invention may be practiced with 4-port PEs arrayed in a module comprising a 4×4 board-mounted PE lattice. Each PE has four physical ports, which connect to the similar ports of its lattice neighbors. Each PE has an internal capability to be configured to route signals to or from any of its neighbors. Thus, for tree topologies, any of the four neighbors of a given PE may be selected as the parent of the given PE; and any or all of the remaining three neighboring PEs may be selected as the child(ren) PEs. The PE ports are configured under the control of a remote host, which establishes an initial desired PE topology. The operability of the PEs is tested, and information on faulty PEs or communications paths is used to enable or disable nodes as necessary by revising the PE port configurations. The nodes thus are reorganized and can run or continue running, on a degraded basis.

14 Claims, 9 Drawing Sheets

A FAULT-TOLERANT GENERALIZATION OF THE LEISERSON EXPANSION SCHEME

A PATTERN RECOGNITION SYSTEM

LEISERSON EXPANSION SCHEME FOR A
BINARY TREE MACHINE

A FAULT-TOLERANT GENERALIZATION OF THE LEISERSON EXPANSION SCHEME

SELF-TEST AND REPAIR (STAR) GROWING A TREE WITHIN A LATTICE

BOARD MODULE WITH 16 PROCESSING ELEMENTS

NODE INITIALIZATION

RECONFIGURABLE SIGNAL PROCESSOR

FIELD OF THE INVENTION

This invention relates to concurrent computer architectures; and particularly to realizing a generic capability for a fault-tolerant and reconfigurable multiprocessor computer scalable to thousands of processor elements.

BACKGROUND OF THE INVENTION

Concurrent computer architectures are configurations of processors under a common control interconnected to achieve parallel processing of information. Processors arrayed in linear strings, sometimes termed "systolic" architectures, are an increasingly important example of concurrent architectures. Another such architecture is the binary tree, in which the nodes are arranged in levels beginning with a single root and extend to two, four, eight, etc. computing nodes at successive levels.

Pattern recognition is one class of problem to which parallel processing is especially applicable. Pattern recognition is the comparison of an unknown signal pattern to a set of reference patterns to find a best match. Applications include speech recognition, speaker recognition, shape recognition of imaged objects, and identification of sonar or radar sources.

One requirement of multiprocessor architectures important to the solution of pattern recognition and other problems, is scalability of the hardware and the programming environment. Scalability refers to use of the same individual PEs, board-level modules, operating system and programming methodology even as machine sizes grow to tens of thousands of nodes.

Although scalability has been achieved in machines adapted to pattern recognition, its practical realization especially in larger machines has been limited by a lack of tolerance to faults exhibited by the relatively fixed PE lattice structures heretofore used. Schemes in the prior art which supply fault tolerance by adding redundant processing elements and elaborate switching details to disconnect a failed PE and substitute a spare, are expensive and take up space.

If fault tolerance and scalability can be achieved, however, parallel processing offers real-time execution speed even as the problem size increases. For example, a GigaFLOP (one billion floating point operations per second) or more of processing can be required to achieve real-time execution of large-vocabulary speech recognition apparatus. Pattern recognition for future speech recognition algorithms will easily require 100 to 1000 times greater throughput. In general, pattern recognition for higher bandwidth signals, such as imagery, will require a TeraFLOP (one trillion floating point operations per second). Fault-tolerant, scalable, parallel computing machines having hundreds or thousands of PEs, offer a potentially attractive choice of solution.

A property related to scale, is fast execution of communications between a Host computer and the PE array. PE configurations assembled as a binary tree, for example, have the advantageous property that if the number of PEs in the tree array are doubled, the layers through which communications must pass, increase only by one. This property, known as logarithmic communications radius, is desirable for large-scale PE arrays, since it adds the least additional process time for initiating and synchronizing communications between the Host and the PEs. Scalability is served by devising a single, basic PE port configuration as well as a basic module of board-mounted PEs, to realize any arbitrary number of PEs in an array. This feature is critical to controlling the manufacturing cost and to systematically increasing the capacity of small parallel processing machines. Prior art arrangements of high count PE configurations have not met this need, however; and further, have tended to increase the installation size and pin-out count for backplane connections.

TeraFLOP capacities requiring many thousands of PEs in a single system, also currently are prohibitively expensive if realized in the inflexible and permanent hard-wired topologies of the current art. Additionally, fault tolerance in conventional hard-wired PE arrays has been limited heretofore, because the PE interconnection relationships are relatively determined by the wiring. For this same reason, hard-wired PE arrays are not generally reconfigurable.

OBJECTS OF THE INVENTION

Accordingly one object of the invention is to increase the fault tolerance of concurrent computer architectures.

Another object of the invention is to permit the reconfiguration of a concurrent computer architecture into any of a multiplicity of processing node topologies.

A further object of the invention is to achieve the foregoing objects without appreciably adding to backplane bus connections.

A further object of the invention is to provide in a concurrent computer architecture an interconnected lattice array of processing elements which under software control can be reconfigured to utilize virtually every functional node despite faults in multiple other nodes.

A further object of the invention is to achieve greater scalability in parallel processor architectures.

SUMMARY OF THE INVENTION

This invention contemplates the use of a unique interconnection scheme among the PEs of a multiprocessor computing architecture; and means utilizing the unique interconnections for realizing, through PE reconfiguration, both fault tolerance and a wide variety of different overall topologies including binary trees and linear systolic arrays. The reconfigurability realizable pursuant to this aspect of the invention, allows many alternative PE network topologies to be grown or embedded in a PE lattice having identified PE or inter-PE connection faults. Further, under the control of the same fault-identification and route-around routine, the invention detects and compensates for faults occurring during operation.

In a specific illustrative embodiment, the invention is realized through use of 4-port PEs arrayed in a square 4×4 rectangular lattice which constitutes a basic 16-PE module. Each PE has four physical ports, which connect to the similar ports of its respective neighbors. For tree topologies, any of the four neighbors of a given PE may be selected as the parent of the given PE; and any or all of the remaining three neighboring PEs may be selected as the child(ren) PEs.

Typically, three of the four ports of a given PE are assigned to connect to adjacent PEs, these being the parent and two children of the given PE. The aggregate of unused fourth ports of each PE allow the PE lattice to be reconfigured to effect a large number of changes in parent-child relationships. Reconfiguration bypasses identified faults in a given topology. Reconfiguration also creates different computing node topologies.

The functionality of the ports of each PE, which define the neighbor relations, may be controlled by instructions from an exterior source, such as a Host computer. The process for routing among ports within each PE may be software-defined.

By using a novel variant on a tree expansion scheme, the invention allows for virtually arbitrary up-sizing of the PE count to build virtually any size of tree network, with each size exhibiting the same high degree of fault tolerance and reconfigurability.

In a particular aspect, the invention provides predetermined node fault correction routines to specific node faults. This inventive feature is particularly applicable to single-program-multiple-data binary tree (in which a given PE communicates only with its parent and has from zero to two children); and single-threaded linear systolic arrays. For these topologies, the invention teaches mapping or imprinting a software-defined and controlled topology onto the fixed hardware and avoiding identified faults, without an expensive commitment of software overhead and run-time loss.

The same software controlled routing and the same physical interconnection pattern of the sub-networks as described so far, can be used to realize fault-tolerant "systolic" networks. These networks in their simplest form are realized with a linear string of PEs, with each PE requiring a single input and a single output port. The 4-port PE lattice provides extensive flexibility in realizing the linear systolic structure in any of a number of serpentine patterns, by routing around defective PEs.

The 4-port PE, together with the flexibility in routing, also allows the systolic structure to be expanded at particular stages of processing when the processing tasks require.

Advantageously, by building the modules with redundant backplane busses, and interconnecting each of the redundant backplane busses from one module to a different module, a network of modules is created that enables routing around an entire module which has failed.

The invention and its further objects, features, and advantages will be further elucidated in the detained description to follow and in the DRAWING, in which:

DETAILED DESCRIPTION OF AN ILLUSTRATIVE EMBODIMENT

Figure 1:
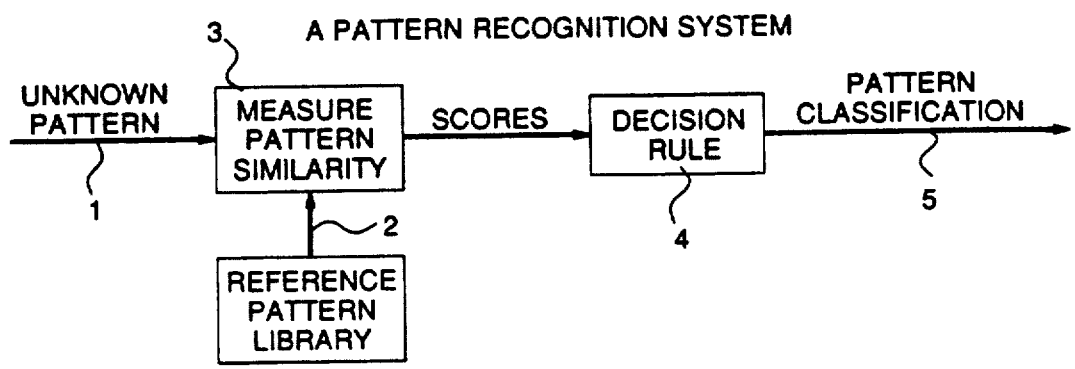
FIG. 1 is a block diagram of a conventional process for signal pattern recognition.

The present invention's applications will be more readily appreciated by first considering certain prior art. Accordingly, FIG. 1 depicts a simplified conventional process for signal pattern recognition, in which an individual unknown pattern 1 and a specific known pattern 2 from a library or set of known patterns are compared according to some instruction set in unit 3, a similarity function generator. Unit 3 develops a comparison measure, for example, a distance or probability score, which is transmitted to a filter 4. A decision rule is implemented by filter 4, for example selecting that reference pattern which is of minimum distance to the unknown, the result of which is a pattern classification output 5.

Figure 2:
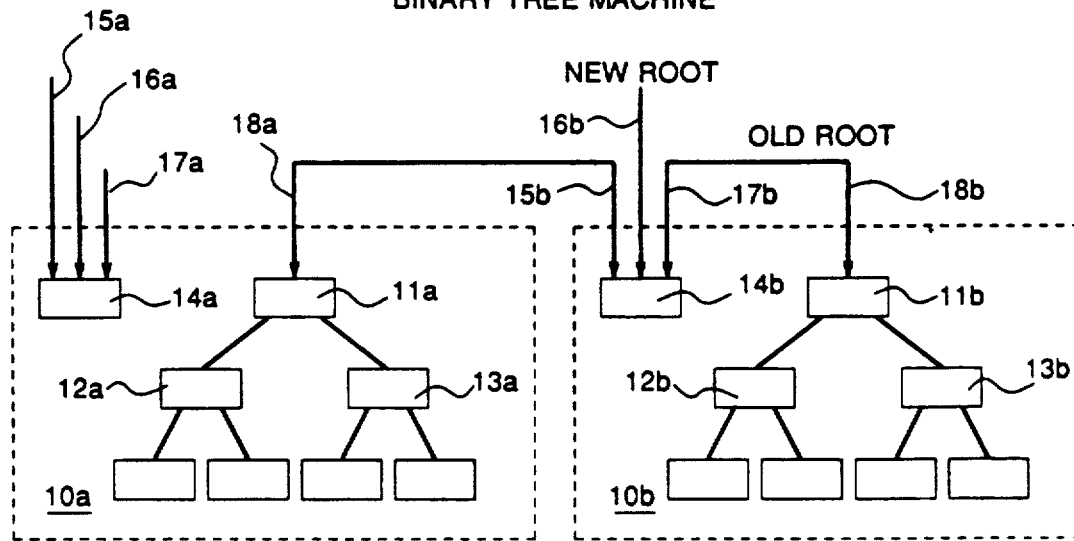
FIG. 2 is a block diagram of a conventional expansion scheme for a tree machine.

The unit 3 may, for example, be a binary tree machine. These vary in size or "depth", depending on the problem complexity. One method for expanding the size of a binary tree machine, known as a "Leiserson Expansion", involves repeated use of identical 4-lead modules, as depicted in FIG. 2. Two such modules, denoted 10a, 10b, illustrate the method. Each consist of a subtree comprising a root 11a, 11b which are "parents" respectively of "children" 12a, 13a in module 10a; and "children" 12b, 13b in module 10b. These children in turn are parents to further PEs. Included in each module 10a, 10b is an expansion PE denoted 14a, 14b, each having three ports 15a, 16a, 17a; and 15b, 16b, 17b respectively. The ports 18a, 18b respectively leading from the root PE 11a, 11b, of each subtree, constitute the fourth port of each identical module.

Two such modules may be interconnected in such a way that the four-port convention for the resulting combination of the modules 10a, 10b, is maintained. As shown in FIG. 2, the subtree root port 18b of module 10b is connected to port 17b of the expansion PE 14b; and the subtree root port 18a of module 10a is connected to the port 15b of the expansion PE 14b. The resultant two-board system has a 15-PE tree with root PE 14b and an expansion PE 14a. This combination can now be interconnected to further identical modules through ports 15a, 16a, 17a of expansion PE 14a of module 10a; and the port 16b of expansion PE of module 10b, the latter port becoming the "new root" for module 10a. The resultant network again comprises a subtree of PEs, plus one PE—namely PE 14a of module 10a, which is available for expansion.

Since the resultant network after the interconnection is equivalent in number of ports to the network in the individual modules 10a, 10b prior to interconnection, the illustrated interconnection scheme may be applied iteratively with ever-increasing module sizes.

The preceding scheme is not, however, operationally practical for machines comprising thousands of PEs because it is not sufficiently fault-tolerant. For example, if the subtree PE 11b were to fail, all children would be disconnected. Thus, failure of a single component could disproportionately reduce the available number of PEs.

A Fault-Tolerant Expansion Scheme

The present invention, inter alia, provides a mechanism for achieving binary tree expansion, which retains the requisite constant number of basic module ports while also providing a substantial degree of tolerance to PE faults.

Figure 3:
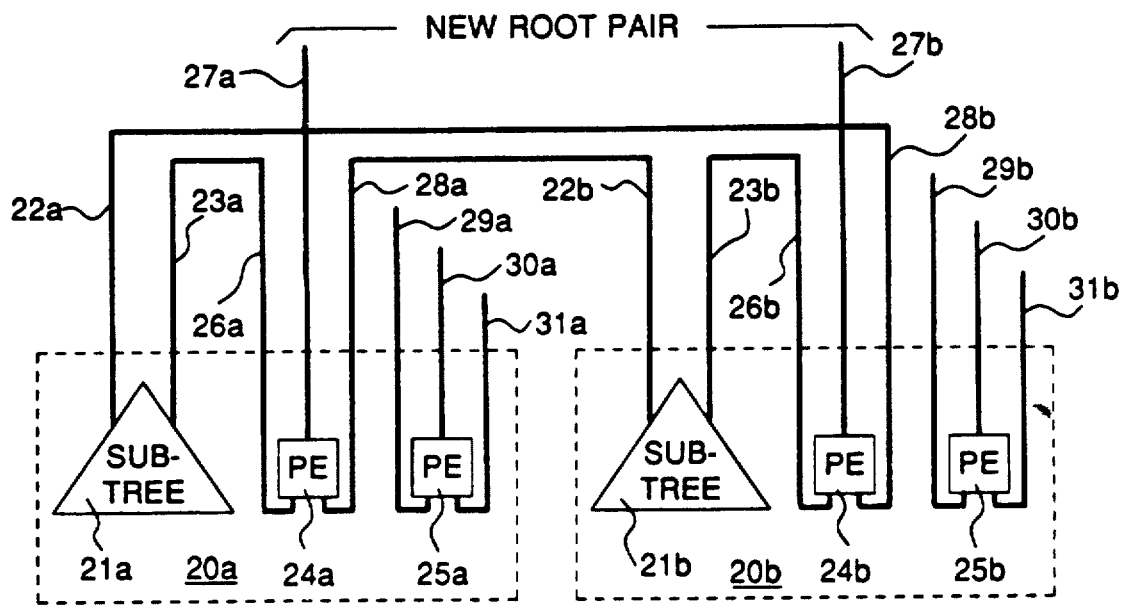
FIG. 3 is a block diagram of a fault-tolerant tree expansion scheme.

The basic fault-tolerant PE module is depicted in FIG. 3. Two such modules, 20a, 20b illustrate the principle. Each contains a subtree 21a, 21b respectfully, with each of the latter served by two busses 22a, 23a; and 22b, 23b. The subtrees 21a, 21b may each consist of a multiplicity of PE modules, for example, realized by the configuration shown in FIG. 4. Either of the two busses serving each subtree may be selected as the root bus of that subtree.

In accordance with the invention, each of the modules 20a, 20b include two expansion PEs, denoted 24a, 25a; and 24b, 25b respectively. Each expansion PE has three ports labeled as follows: for PE 24a-ports 26a, 27a, 28a; for PE 24b- ports 26b, 27b, 28b; for PE 25a-ports 29a, 30a, 31a; and for PE 25b- ports 29b, 30b, 31b.

Each of the expansion PEs thus has three off-board ports available for expansion. The connection paths to/from each module 20a, 20b, therefore total eight, compared to four in the non-fault- tolerant scheme of the prior art.

In accordance with the invention, the two modules 20a, 20b may be interconnected in a way that retains at eight the number of external connection paths. One illustrative way, shown in FIG. 3, is to effect the following connections of subtree busses and PE ports: bus 22a to PE port 28b; bus 23a to PE port 26a; bus 22b to PE port 28a; and bus 23b to PE port 26b. The result is that the combination of the two 8- port modules 20a, 20b retains the eight-lead connection convention. Ports 27a and 27b of the PEs 24a, 24b, become the "new roots"; and the ports 29a, 30a, 31a of spare PE 25a together with the ports 29b, 30b, 31b of spare PE 25b, constitute the eight external interconnections.

The resultant composite network is a subtree with either of two busses 27a, 27b selectable for use as the root bus, and with two PEs 25a, 25b available for expansion. A failure of hardware associated with either of the candidate root busses 27a, 27b may be overcome simply by selecting the alternative root as the operational root bus.

It will be apparent hereinafter in connection with FIG. 5, that by selectively configuring ports of PEs in an array such as an x-y matrix, spare PEs can be created and then integrated into either subtree PE topology.

Fault-Tolerant Lattice of PEs

Figure 5:
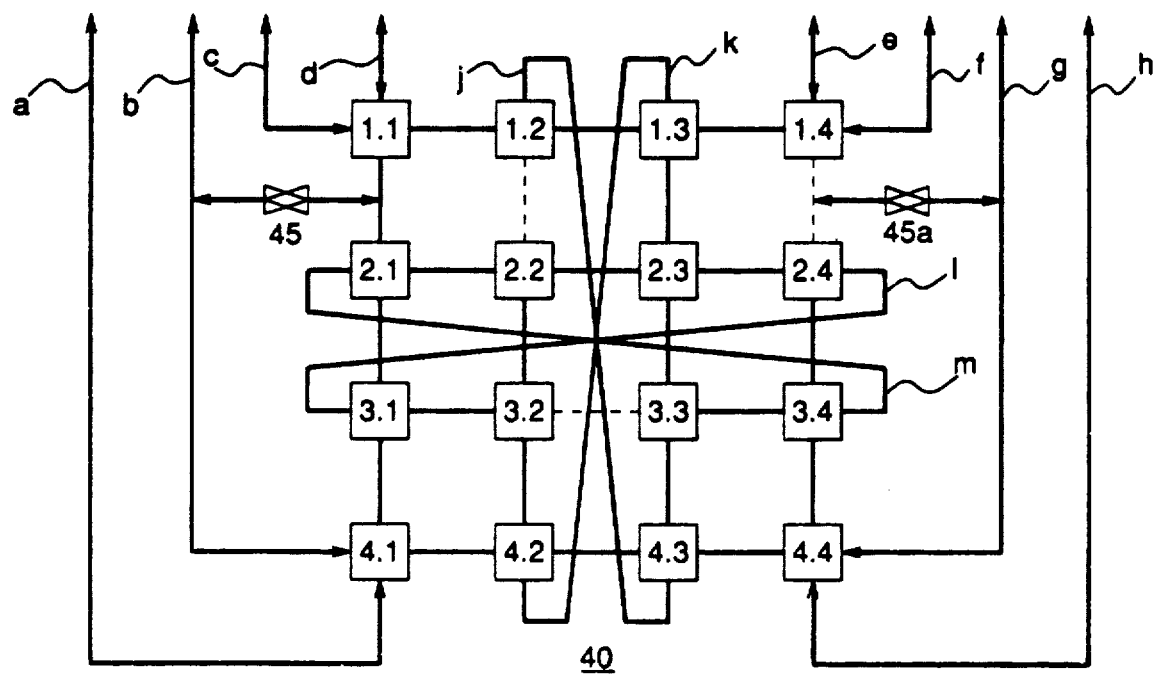
FIG. 5 is a block diagram of 16-element board module showing external and internal connections.

As shown in FIG. 5, the PE lattice at the board level, denoted 40, advantageously (although not necessarily) is an extended four-by-four rectangular array of 4-port PEs, totaling sixteen for each board. Each PE is denoted by row and column call-outs 1.1 ... 4.4. Each of the four internal PEs is connected to each of its four neighbors. Thus, PE 2.2 is connected to PEs 1.2, 2.3, 3.2, and 2.1. Each of the four PEs 1.1, 1.4, 4.1, and 4.4 at the corners of the array 40, are connected to their respective two neighboring PEs, such as PEs 2.1 and 1.2 in the case of corner PE 1.1.

Further, each of the four corner PEs have two ports through which the board 40 can be connected to additional modules or to a Host. These external ports are denoted a, b for PE 4.1; c, d for PE 1.1; e, f for PE 1.4; and g, h for PE 4.4.

The remaining eight PEs are paired by four interconnection paths, denoted j, k, l, and m, respectively to interconnect the PE pairs 1.2 with 4.3, 1.3 with 4.2, 2.1 with 3.4, and 3.1 with 2.4.

The expansion PEs 25a and 25b illustrated in FIG. 3, correspond to the PEs 1.1 and 1.4 in FIG. 5. The roots of the subtree correspond to PEs 4.1 and 4.4; so that busses 22a and 23a of module 20a in FIG. 3 correspond to busses a and h of FIG. 5.

Growing Minimum-Depth Binary Tree in a Two-Fault Lattice

Using the concepts illustrated, a variety of alternate routing options between PEs are available in each module. A basic 4-by-4 PE board- level array is depicted schematically in FIG. 5, where the PEs are given the call-outs 1.1 ... 4.4. The depicted array is similar to that of FIG. 4, where in addition, nomenclature is within each PE symbol to represent the "depths", or layer distances, of various PEs from the root PE of the array.

Figure 4:
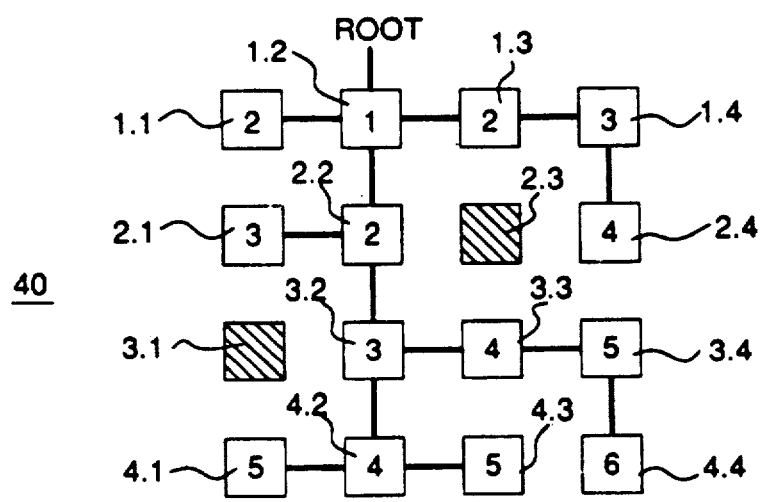
FIG. 4 is a block diagram of a PE array of 16 elements.

In the example illustrated in FIG. 4, the two PEs denoted 2.3 and 3.1, are assumed to have faults; and the requirement is to "grow" a tree using the remaining PEs of the array. Further, however, it is desired to create a binary tree having a minimum depth between the PE chosen as the root and the most remote "leaf".

First, a boundary PE is selected as the root; in this illustration, PE 4.1. Then, in a manner described in detail hereinafter, a message is issued to each of the PE leaves, instructing each leaf to send a message to the (at most three) non-parent neighboring PEs, interrogating whether they are available as potential children.

If a given neighbor PE already has a parent, a code is generated causing the PE which sent the interrogation to not adopt that PE as a child. If a given neighbor PE is detected as one that has a fault, or does not respond to the interrogation, a code is generated causing the PE which sent the interrogation to not adopt that PE as a child.

If a given neighbor PE has received only one request for adoption, a code is generated causing the sending PE to adopt that PE as a child. Finally, if a given neighbor PE has received more than one request for adoption, then a code is generated causing that PE to randomly select one of the parent candidates as its parent.

The resulting set of leaves are those most recent adoptees, plus any previous leaves that in the above process were not able to adopt any children. The tree thus configured consists of: PE 4.1 as the root and first level; second-level children of root PE 4.1 consisting of: PE 4.2; third level children of the second-level leaves consisting of: PEs 3.2 and 4.3; and fourth-level children consisting of: PEs 2.2, 3.3, and 4.4, etc. The structure extends to six levels, as shown in FIG. 4; and bypasses the faulty PEs 3.1 and 2.3.

Figure 13:
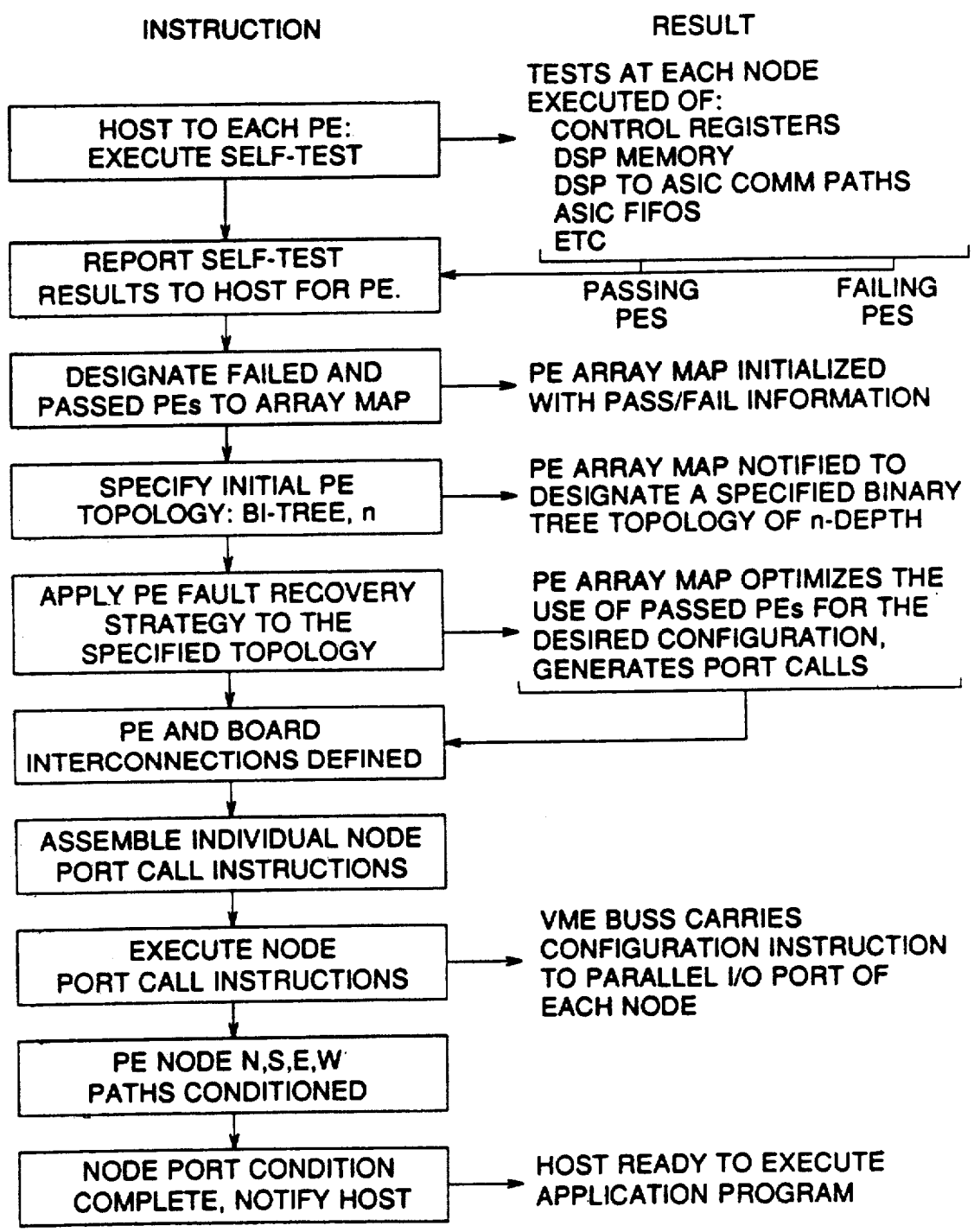
FIG. 13 is a flow chart depicting the process for initializing the PE arrays.

The process for initializing the PE array, which includes orienting the ports of each PE to serve as parent/child or child/parent paths, is also depicted in FIG. 13.

This arrangement's tolerance to PE faults is highly advantageous. First, the arrangement is tolerant to a double fault of the type illustrated. It is also tolerant to a double fault if one of the fault-pair is "internal"; or if the pair comprises a root and an expansion PE. Even if both roots fail, one of the expansion PEs can be configured as a root, still providing fault tolerance.

Referring again to FIG. 3, if both of the expansion PEs 25a, 25b fail, a degree of fault tolerance is still provided: there will always be one board whose expansion PE is not utilized. If, for example, the fault-pair comprises both expansion PEs on one board such as PEs 24b, 25b, a fault avoidance strategy is to choose that board whose expansion PE is not required.

Of course, if there are no faults, then the expansion PEs can all be subsumed into the subtree modules 21a, 21b, thereby utilizing all available processors. The process depicted in FIG. 13 also illustrates this feature.

The virtual tree machine shown in FIG. 4 is skewed, in that the leaves are of variable depths. Also, the structure is not purely binary, because the branching factor at each leaf varies between one and three. The impact of these conditions on total execution time is, however, negligible. Importantly, the machine retains a logarithmic communications radius, and uses identical and scale-invariant modules to "grow". Once realized in hardware, the machine also offers the necessary small and constant pin-out from the PEs and submodules.

Fault-Tolerance for Systolic Arrays

A conventional systolic topology can be configured in a variety of ways in the 16-element array of FIG. 5. An exemplary sequence is to enter the array at PE 1.1, then proceed through PEs 1.2, 1.3, 1.4, 2.4, 2.3, 2.2, 2.1, 3.1, 3.2, 3.3, 3.4, 4.4, 4.3 and 4.2, exiting at PE 4.1.

A systolic topology can also be implanted within the interconnected PE configuration of FIG. 5, despite a single fault condition at any one of the 16 PEs. For example, given a fault at the corner PE 1.1, a systolic array may be grown by connecting the remaining 15 PEs in the following serial sequence: entering the array at PE 4.1, then proceeding through PEs 4.2, 4.3, 4.4, 3.4, 3.3, 3.2, 3.1, 2.1, 2.2, 1.2, 1.3, 2.3 and 2.4, and exiting at PE 1.4.

An inspection of FIG. 5 will also reveal that a 15-element systolic configuration essentially the mirror image of the just-described systolic configuration, can be grown if the single fault occurs at any of the other corner PEs 4.1, 4.4, or 1.4. A fault at PE 4.1, for example is removed by entering the array at PE 1.1, then proceeding through PEs 1.2, 2.2, 2.1, 3.1, 3.2, 4.2, 4.3, 3.3, 2.3, 1.3, 1.4, 2.4, 3.4, and exiting at PE 4.4. The geometries of the PE interconnection paths which compensate for a single fault at any of the corner PEs, are congruent.

Consider next a fault at PE 1.2, which along with PEs 1.3, 4.2 and 4.3 are interior to the corner PEs and located on the north and south sides of the array periphery. The fault-compensating path is selected by entering at PE 1.1, then proceeding through PEs 2.1, 2.2, 2.3, 1.3, 1.4, 2.4, 3.4, 3.3, 3.2, 3.1, 4.1, 4.2, 4.3, and exiting at PE 4.4. Again, an inspection of FIG. 5 will demonstrate that a path of this same geometry will also compensate for a single fault at any of the PEs 1.3, 4.2 and 4.3.

Consider now a fault at PE 2.1, which along with PEs 3.1, 2.4 and 3.4 are also interior to the corner PEs and located on the east and west sides of the array periphery. The fault-compensating path is selected by entering at PE 1.1, then connecting through PEs 1.2, 2.2, 3.2, 3.1, 4.1, 4.2, 4.3, 3.3, 2.3, 1.3, 1.4, 2.4, 3.4, and exiting at PE 4.4. A path of this same geometry will also compensate for a single fault at any of the PEs 3.1, 2.4, and 3.4.

Finally, consider a fault at the interior PE 2.2, one of four PEs including PEs 2.3, 3.2 and 3.3 which in the 4×4 array of the illustrative embodiment are not on the periphery of the array. The fault-compensating path is selected by entering at PE 4.1, then proceeding through PEs 4.2, 4.3, 4.4, 3.4, 3.3, 3.2, 3.1, 2.1, 1.1, 1.2, 1.3, 2.3, 2.4, and exiting at PE 1.4. Again, a path of this same geometry will also compensate for a single fault at any of the PEs 2.3, 3.2 and 3.3.

The significance of the symmetries just described, is that for systolic architectures, only four one-fault PE reconfiguration patterns are needed to cover the possible 16 cases of single faults. Each yields full use of the 15 functioning PEs.

Other specific reconfiguration paths of serially connected PEs may be created besides the examples elucidated above to correct for a single PE fault in a systolic array.

Figure 6:
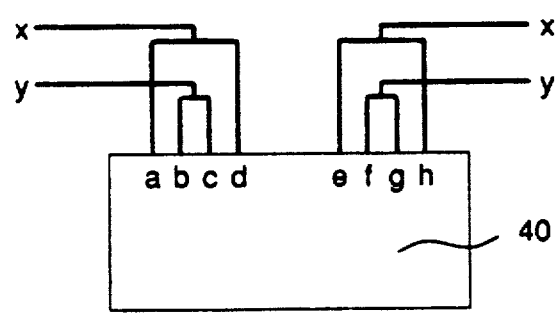
FIG. 6 is a schematic diagram of a PE board of the invention, with a specific set of external leads.

It may be generalized that the fault tolerance of the array depicted in FIG. 5 is realized in a 4×4 array of PEs by providing two separate accesses (for entering or exiting the array) at each of the four corner PEs. One means for realizing this capability in a physical embodiment such as depicted in FIG. 5, is to tie the metallic leads together in the backplane in the manner shown in FIG. 6. With leads b and c tied to common lead y, as shown, a path through lead y is afforded to both corner PEs 1.1 and 4.1. With leads a and d tied to common lead x, as shown, a path through lead x is afforded to the same two corner PEs 1.1 and 4.1.

Figure 7:
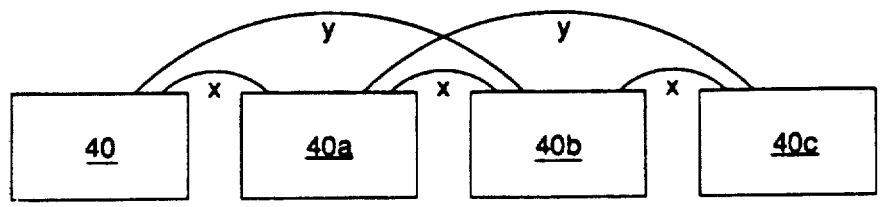
FIG. 7 is a schematic diagram showing options for interconnecting 16-element PE boards.

These redundant paths into and out of a PE board also make possible the bypassing of an entire PE board in a multi-board arrangement. FIG. 7 illustrates boards 40, 40a, 40b and 40c. Adjacent boards are connected by tying the x-leads created as described with respect to FIG. 6. Boards once removed from each other are connected by tying the y-leads. A catastrophic failure of entire board 40a, for example, is bypassed by the connection denoted y-prime, which enables board 40 to gain access to board 40b through either the latter's PE 1.1 or 4.1. These are the same PEs which were connected to failed board 40a.

As seen in FIG. 5, buffers 45, 45a, respectively control the direction of signals between lead b and the connection path for PEs 1.1, 1.2; and, similarly, the direction of signals between lead g and the connection path for PEs 1.4, 2.4. Each buffer 45, 45a is a conventional tri-stable, bi-directional device available commercially. Under the direction of an external control means such as a Host computer, buffer 45 can assume a first state in which lead b furnishes only an input signal to the module 40. In a second state, the lead b furnishes only an output signal from module 40. In its third state, the circuit is open and no signals pass to or from lead b. The operation of buffer 45a is identical to that of buffer 45. The function provided by the buffers 45, 45a, is to add connection options to and from module 40. If, for example, PE 1.1 is unable to pass signals from/to either leads c or d, access to module 40 which bypasses PE 1.1 is afforded by lead b through switch 45a, placed in one of its transmission states. Buffers 45, 45a are included in this realization to provide the required variety of access ports to the lattice while limiting the number of connections to the backplane. The buffers provide more alternative topologies in routing around defective processor elements, and also lead to efficiencies in backplane connections.

General Hardware and Control for Fault Recovery and Reconfiguration

A variety of control means can be envisioned to configure and reconfigure the PEs in accordance with the invention. An illustrative description of the structure of each node, which enables the process control set forth in FIG. 13 to be exercised, will first be presented.

Figure 8:
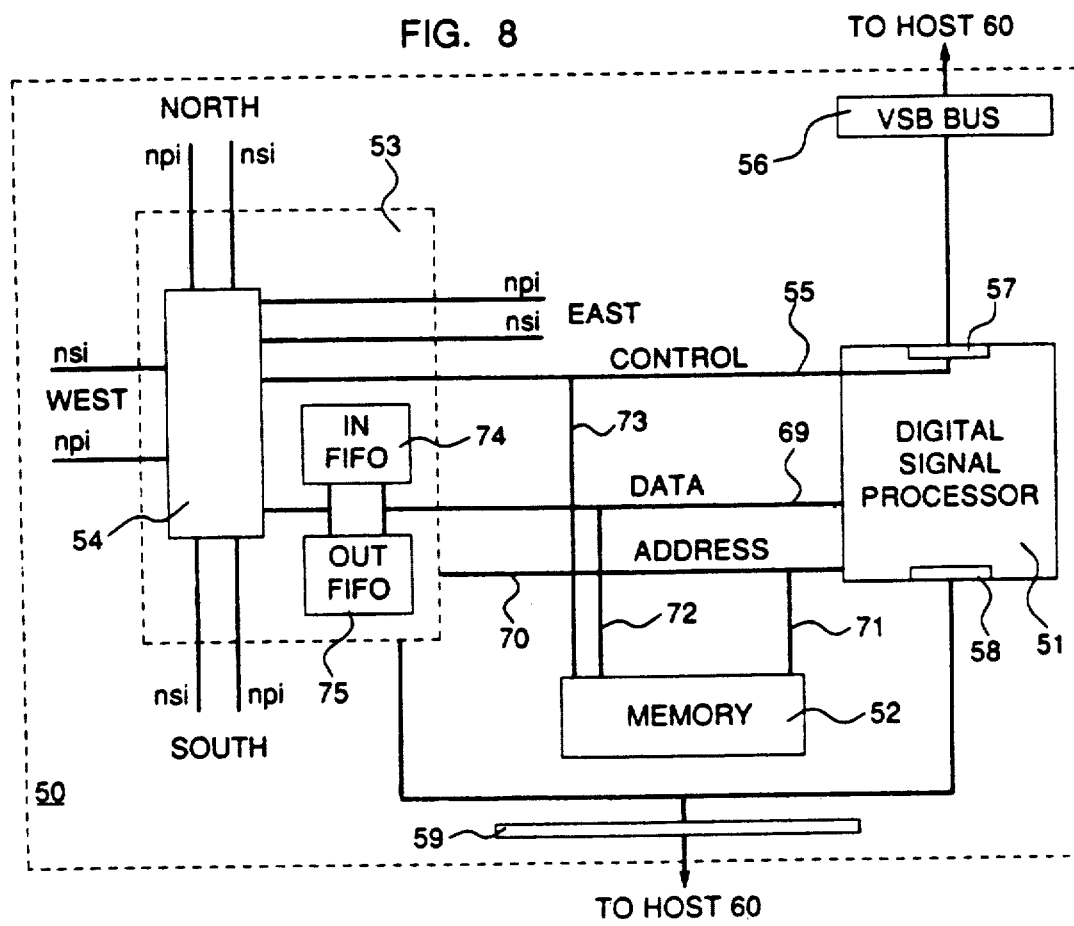
FIG. 8 is a block diagram showing functionalities of each PE node.

Each processing node, denoted 50 in FIG. 8, consists of a digital signal processor 51, a memory 52 external to processor 51, and a configuration network 53. Processor 51 may advantageously comprise a digital signal processor chip available from American Telephone and Telegraph Company under the name "DSP32C". Memory 52 may comprise eight 64K×4 static RAM chips, each being a CY7C196 device available from Cypress Semiconductor Corporation. Network 53 may comprise, for example, an application-specific integrated circuit chip manufactured by AT&T as a semi-custom 0.9 micron twin-tub CMOS device disposed in a 224-pin grid array.

The functionalities provided by Network 53 include a crosspoint switch array 54, an input FIFO 74, an output FIFO 75, and four neighbor-ports denoted north, south, east, west. Data signals communicated to or from DSP51 during the run of an application program are routed to the neighbor-ports through the input FIFO 74 and output FIFO 75.

Figure 9:
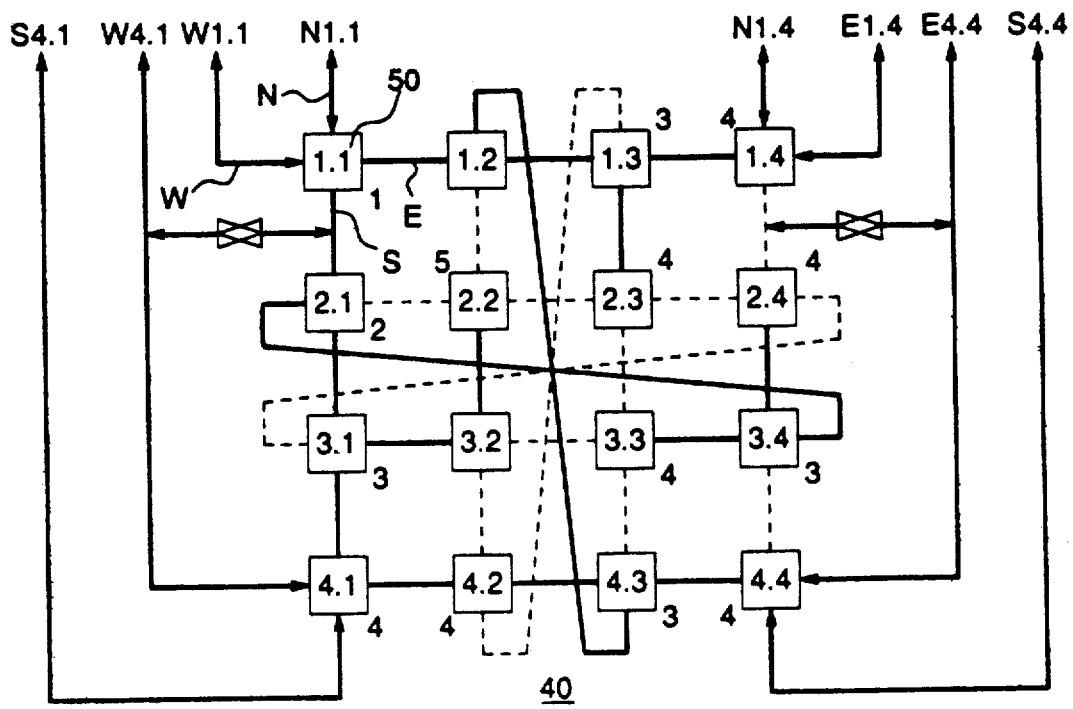
FIG. 9 is a block diagram of particular PEs on a board, interconnected in a tree structure with exemplary external linkages.

The four ports of each node 50, are designated N, E, S, and W. Each of the four ports is provided with a node-parallel interface ("NPI"), labeled 61, 62, 63, and 64 respectively, as seen in FIG. 8. Data and header information between neighboring nodes, that is, the nodes 1.1-4.4 shown in FIG. 5, are communicated through the NPIs. Particular data/header communication linkages between nodes are set up to establish a desired topology. FIG. 9 illustrates a board 40 consisting (unlike the nodes of FIG. 4) of all functioning nodes 1.1-4.4. These have been configured into a tree topology. The solid lines connote the paths between the nodes which are utilized in the tree structure; dotted lines connote paths which are not used. Typically if a port N is designated as a parent, port S is either an unused or an adopted child; port E is the parent node's left-child; and port W is the parent node's right-child. FIG. 9 also shows the eight exterior connections for the illustrated board 40. These are denoted with their "direction" labels, and with the associated PE label: S4.1, W4.1, W1.1, N1.1, N1.4, E.1.4, E4.4, S4.4. In the following section, the role of the ports in initial configuration will be described.

Initial Tree Configuration of NPIs at Nodes

For each PE 50, a configuration message determines: (a) which of the PE ports N,S,E,W are participating, i.e., included, in the tree either as parent or children; (b) which port connects to the current PE's parent; (c) whether the parent port is the input port and the children ports are the output ports (as in the case of "BROADCAST" mode), or vice-versa (as in the case of "REPORT" mode); and (d) which ports are currently active, i.e., being used to read or write to a child PE; and which ports are currently passive.

Figure 10:
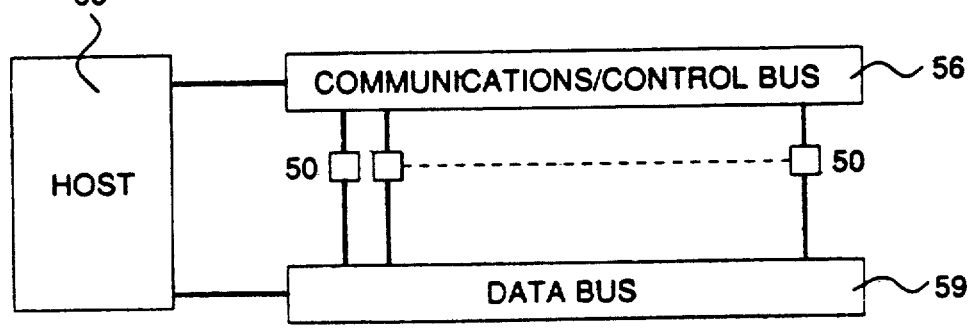
FIG. 10 is a high-level block diagram of a multiprocessor system connected to a Host.

FIG. 10 broadly illustrates an overall parallel multiprocessor system which utilizes the invention in, for example a tree topology as in FIG. 9. FIG. 10 shows a Host computer 60, which may be an AT&T PC 6300+ unit, and only one PE board consisting of 16 PEs of which only three are shown for ease of reading. However, the assembly can and usually will consist of a large multiplicity of PE boards of the type illustrated in FIG. 5.

The initialization process now to be further described, is substantially set forth in FIG. 13. Coded messages are formed in the Host 60 in conventional fashion. A header message is formed to include fields to specify a destination ID, indicating the ID of the PE to which it is to be sent. The header also contains a PASS field to indicate whether, even after reaching its destination, the message should continue to be propagated "downstream".

Figure 11:
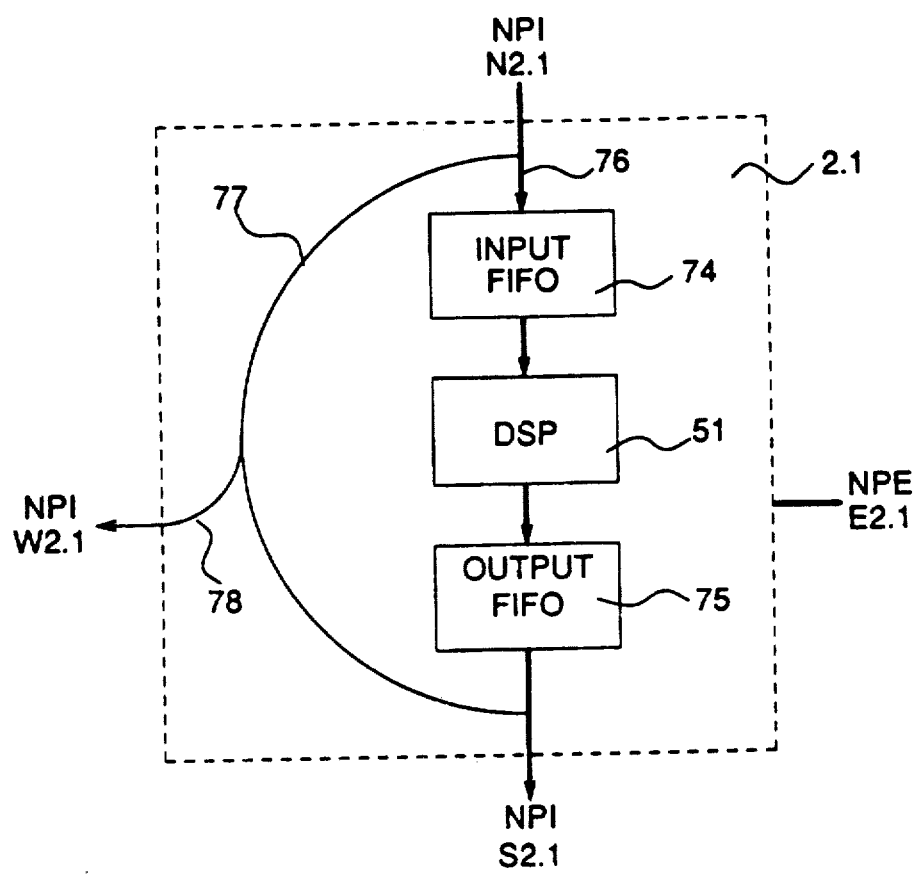
FIG. 11 is a schematic diagram illustrating the data paths resulting from a particular path configuration at a node.
Figure 12:
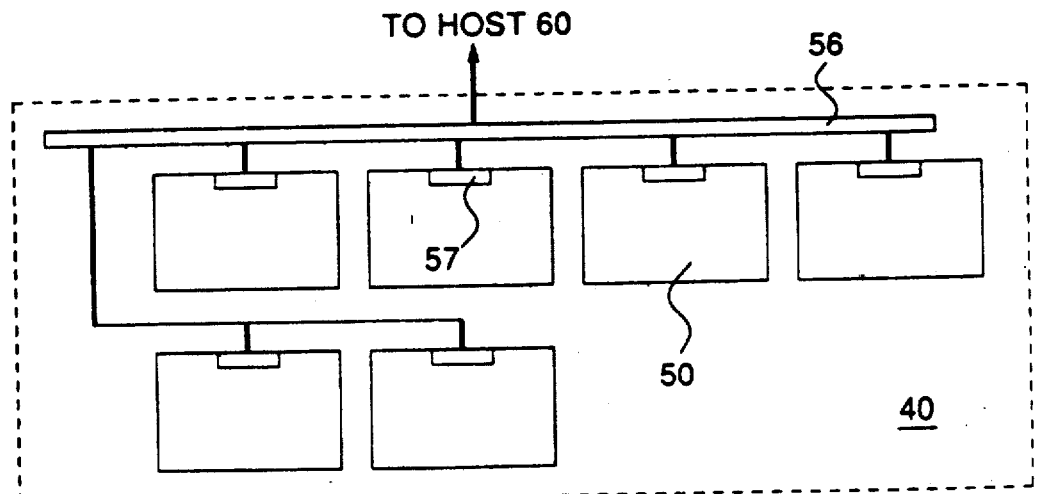
FIG. 12 is a block diagram illustrating the bussing for routing node configuration commands from a Host to multiple boards.

Initial node port configuration control messages from Host 60 to the PEs are sent via parallel communications control bus 56 to each PE 50 of each board 40. These messages instruct each node as to how to establish its ports. FIG. 11 illustrates the configuration of one of the PEs of FIG. 9, arbitrarily PE 2.1. PE 2.1, which is one of two second-level children of board root PE 1.1 is shown with its NPIs configured in the "Broadcast" mode. NPI N2.1 is prepared to receive data messages from NPI S.1.1 of the parent PE. A path denoted 76 is configured from NPI N2.1 to the DSP 51 of PE 2.1 through the input FIFO 74. To support the data processing operations of the PE 2.1. Two data signal routing paths, denoted 77, 78, are provided within PE 2.1, by structures described earlier in connection with FIG. 8. These support the data processing of the lower level PEs. As seen in FIG. 11, input FIFO 74 is not connected when bypass paths 77, 78 are designated.

The tree "leaf" levels and the associated parent-child relationships, of the tree topology illustrated in FIG. 9, achieved in accordance with the described process, are: root PE—1.1; second level—PEs 2.1 and 1.2; third level—PEs 1.3, 4.3, 3.1 and 3.4; fourth level—PEs 1.4, 2.3, 3.3, 2.4, 3.2, 4.4, 4.1, and 4.2; and a fifth level PE 2.2 is provided.

A listing of the process steps and commands in "C" language for a basic operating system at each node is contained in Appendix I. The process as depicted will perform all inter-node communication, will read and write data to/from a node's memory and to the Host 60, will accept instructions and data from the Host 60, and will execute application code, debugging code, etc.

The invention is adapted to the detection of and adjustment for faults during the running of an application. Pursuant to this aspect of the invention, the PEs run periodic test routines; and if a failure is detected, the PE generates a signal for an interrupt to the Host. Interruption of the PE is achieved by conventional writing to the system interrupt bit to invoke the control network of FIG. 10. Interrupts in this direction may be performed via bus 59. The fault route-around instructions generated by Host 60 also adjust for faulted PEs which must be bypassed during the configuration process.

Three-Board Computer Illustrating Inter-Board Path Options, Host Connection Options, and Tree Configuration Avoiding a Faulted PE To review again, each PE of each 16-PE board has four ports. Two of the ports in each of the corner PEs in the lattice are available to effect communications external to the board. Further, each PE port communicates with a one of the ports in the nearest neighbor PE.

Figure 14:
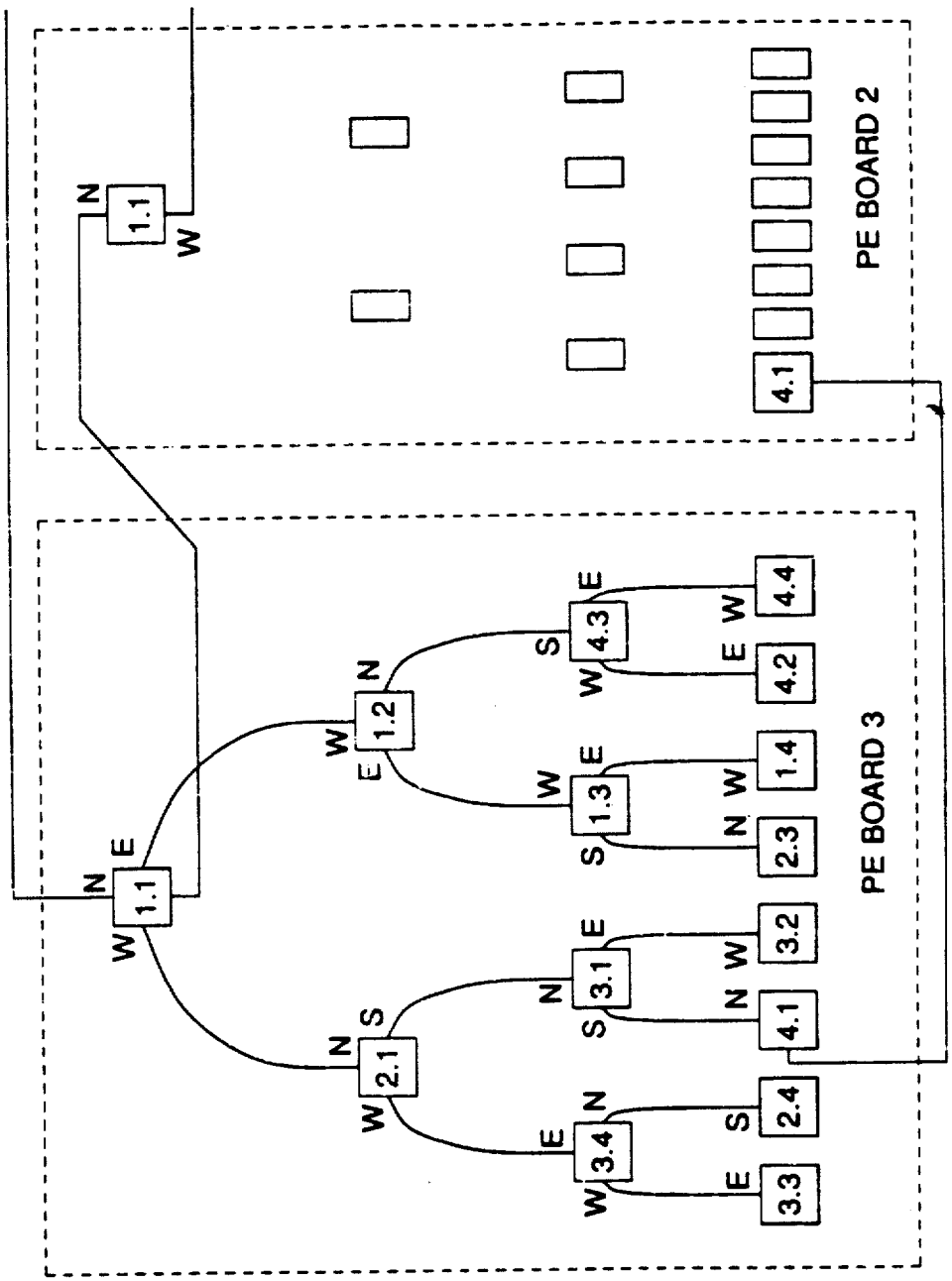
Figure 16:
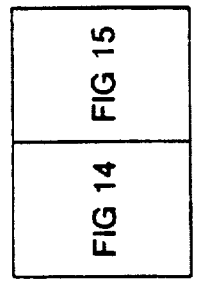
FIG. 16, consisting of FIGS. 14 and 15, portrays in block diagram form, the creating of PE lattices within a PE board by configuring ports.
Figure 15:
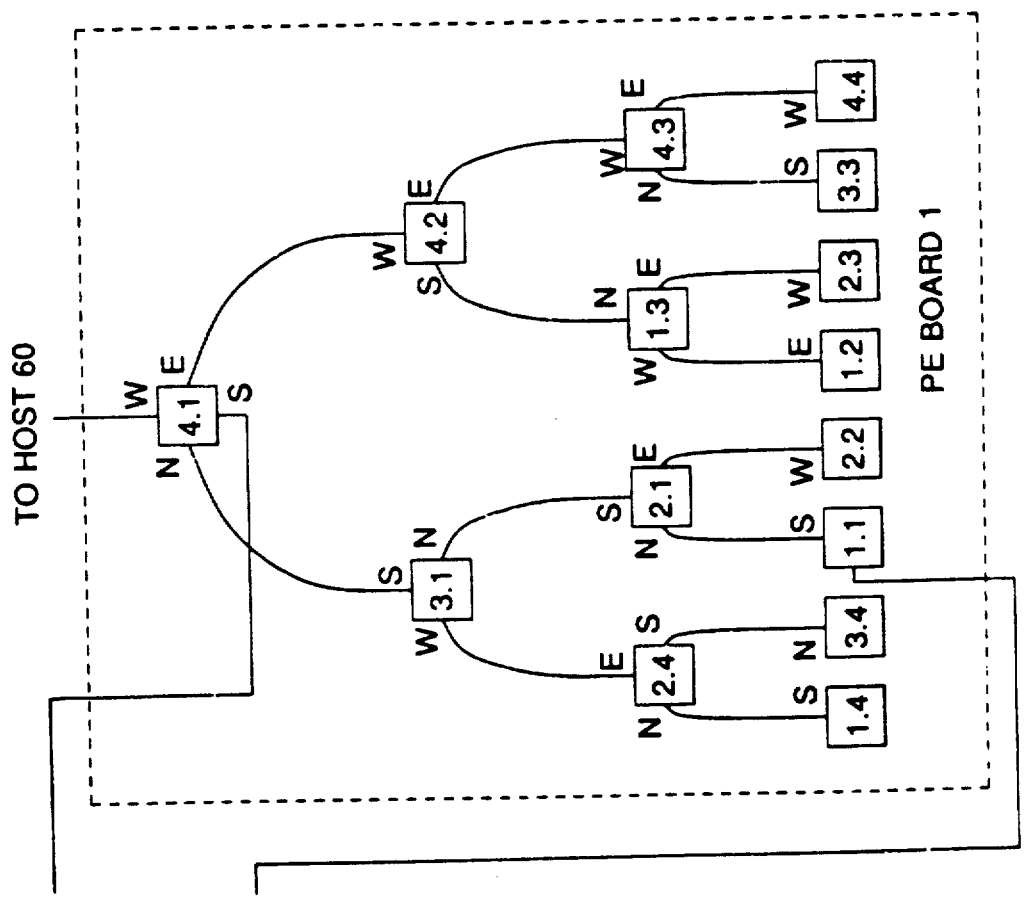

The flexibility afforded to "grow" PE lattices within a PE board by the capability to configure the ports, is now further illustrated by reference to FIGS. 14 and 15 (together, FIG. 16). Three PE boards, denoted 1, 2, and 3, are shown with the port-to-port PE connections for a tree lattice structure. The PEs are shown not in their fixed lattice positions, but rather in the actual tree geometry for data flow, which is created when the PE ports are configured as described above.

It was stated earlier in the description of the basic board module of FIG. 5, that eight external connections (a through h) are provided; and that this number carries out the Leiserson expansion scheme for a binary tree machine. The advantages of these capabilities in practice are several, as will be seen in the example of FIG. 16.

First, the single data flow connection of the three-board arrangement to Host 60, is through the west port of PE 4.1, which corresponds to the connection denoted b in FIG. 5. However, any one of the other seven external connections available at the corner PEs, might also be used as the connection to Host 60, by control instructions from the Host 60 sent during the initialization.

Second, two data paths link the boards 2 and 3 to board 1, providing a redundancy in case one path fails. These paths are determined also by configuring the ports. Board 1 connects to board 3 through the interface comprising port S of PE 4.1 and port N of PE 1.1 on board 3. Additionally, Board 1 connects to board 3 via board 2, through the path between port W of PE 1.1, Board 1 and port W of PE 1.1 of board 2; thence, by any one on several possible routings internal to board 2, to port S of PE 4.1; thence to port W of PE 4.1 of Board 3. Additionally, Board 2 and 3 connect by the route between port N of pe 1.1 of Board 2, and port W of PE 1.1 of Board 3.

Third, the PE tree configuration of Board 1, it will be noted, omits use of PE 3.2, thus illustrating the fault "route-around" capability of the invention in conjunction with furnishing redundant board-to-board paths and a multiplicity of options for connecting the three board unit to the Host.

Persons skilled in the art will readily realize that various topologies, various lattice mappings and multiple Host and board interconnections are feasible through the teachings of the invention.

Library of Reconfiguration Patterns

Persons skilled in the art of real-time computing that computer architecture set-up processes cannot be allowed to interfere with or impede the execution of any real-time calculations. Since, in the multiprocessor topologies of the present invention, a typical node count is from eight to two hundred fifty-six, there could easily be thousands of reconfiguration scenarios to accommodate to one or more node faults. Real-time calculation cannot be afforded on these operations. Therefore, an off-line data base resident in memory 80 of FIG. 10 is supplied with hundreds or thousands of reroute configurations. Each reroute configuration is predetermined to be optimal (i.e., minimum depth of tree leafs) arrangement for the particular number of PEs, the desired topology, and any particular PE faults identified through the initial or on-going tests. The reroute configuration set would include, for example, information on the routing shown in FIG. 9, and in FIG. 5; but also many more.

Additionally, memory 80 is advantageously supplied with specific optimized re-routing of communications paths, to accommodate to backplane connection faults. The latter account for a large fraction of faults experienced in multiprocessor operations.

The present invention can be practiced in the signal pattern recognition computing environment depicted in FIG. 1. Signal pattern recognition problems for which the invention is particularly useful, include: speech recognition, speaker recognition, recognition of imaged objects, and identification of sonar or radar sources. An existing parallel processing configuration on which this invention builds, is described in the copending patent application of A. L. Gorin et al., Ser. No. 034,824, filed Apr. 30, 1987, and assigned to applicants' assignee, which describes the BROADCAST RESOLVE and "REPORT" operations of a speech pattern recognition application; and which to the extent relevant is incorporated by reference.

In summary, the invention is adapted to:

(a) configure, under the control of a remote command module, the interconnection paths of each PE board in the custom backplane in order to synthesize a desired one of many node interconnection topologies including: linear systolic, binary/nonbinary tree, and many forms of hybrid; and (b) enable or disable nodes as necessary by revising the communication paths.

Then, pursuant to the invention, the basic strategy for gaining a measure of tolerance to faults without prohibitive expense, requires:

(c) adding steps to an application program to convey an idealized or nominal system configuration;

(d) providing a means for determining the robustness or health of the PEs of a given configuration; and (e) reorganizing the nodes/PEs to run, or to continue running, on a degraded basis.

Processor Element Node Operating System Functions

```
   #include "decregs.h"
   #define TOTAL_SLOTS      12
   #define MAX_SLOTS        11         /* TOTAL_SLOTS-1 */
   /* ------------------- made up addresses for special processing functions */
   #define halt_cmd         0x3000
   #define suspend_cmd      0x3010
   #define prnt_suspend_cmd 0x3010
   #define irq1_identifier  0xffe000   /* addr of INTREQ1 = start  */
                                       /* of Interrupt Vector table */
10 short int shadowcn, shadowst, shadownp;
   /* ------------------- INTREQ1 interrupt handler table to load addresses into */
   int eor_handler;                /* end of reception */
   int eot_handler;                /* end of transmission */
   int ha_handler;                 /* header available */
   int ofe_handler;                /* output fifo empty */
   int ohf_handler;                /* output fifo half full */
   int ift_handler;                /* input fifo threshold */
   int int1_handler1;              /* reserved for asic timer1 */
   int int1_handler2;              /* reserved for asic start of message */
20 /* ------------------- INTREQ2 interrupt handler table to load addresses into */
   int los_handler;                /* npi loss of synchronization */
   int si_handler;                 /* software interrupt */
   int int2_handler1;              /* reserved for asic - npi parity error */
   int int2_handler2;              /* reserved for asic - npi abort */
   int int2_handler3;              /* reserved for asic - nmi parity error */
   int int2_handler4;              /* reserved for asic - nsi parity error */
   int int2_handler5;              /* reserved for asic - sw loss of sync */
   int int2_handler6;              /* reserved for asic - timer 2 */
   /* ---------------------------------------------------------------- */
30
   int active;
   int end_of_data;
   int STOREat;
   char ID;
   int bytes_recd;

short int output_fifo_empty = 0;
   short int end_of_trans = 0;
   short int if_bytes_left = 0;
40 short int hdwe_error;
   short int sw_error;
   short int usr_error;
            /*      tree configuration variables               */
   short int l_child;
   short int r_child;
   short int m_child;
   short int parent_id;
   short int am_root;
            /* identify which, if any, standard configuration is being used */
   short int std_tree = 0;
   short int std_ring = 0;
   short int std_aray = 0;

/* parameters associated with the command being executed are  */
            /* loaded into these variables                                */
   short int cmd_param1;
   short int cmd_param2;
   short int cmd_param3;
   short int cmd_param4;
60
            /* all user functions */
   int (*user_wait_pgm) ();
   int (*user_sp_pgm) ();
```

```
            /*       status flags                                          */
    short int halted   = 0;
    short int suspended = 0;
    short int usersp  = 0;

short int next_slot = 0;      /* index used to get next command to execute */
    short int fill_slot = 0;      /* index used to get next slot to fill  */
            /* structure defining command queue                           */
    struct cqueue {
            int subrtn;
10          short int param1;
            short int param2;
            short int param3;
            short int param4;
            } mq [MAX_SLOTS];
    struct cqueue *next_slotptr, *fill_slotptr;
    /* command queue receival_slot */
            int new_subrtn;
            short int new_param1;
            short int new_param2;
20          short int new_param3;
            short int new_param4;
    /* ---------------------------------- store cmd parameters while executing */
    int sparam1;                  /*      special processing functions    */
    int sparam2;
    int sparam3;
    int sparam4;
    /* -------------------------------------------------------------------- */
    /* Used to determine where los error occurred                          */
    int wfif = 0;                 /* writing from input fifo              */
30  int wtof = 0;                 /* writing to output fifo               */
    /* -------------------------------------------------------------------- */
    /*       control register masks and definition                         */
    # define srset_ien            0x8000
    # define ien_mask             0x7fff
    # define ofeen_mask           0x6fff
    # define ohfen_mask           0xdfff
    # define haen_mask            0xefff
    # define eoten_mask           0xf7ff
    # define eoren_mask           0xfdff
40  # define iften_mask           0xfeff
    struct scn { /* last 7 are masks, interrupt unmasked if bit = 1        */
            unsigned int node_id : 7;     /* node identification number   */
            unsigned int bcen    : 1;     /* bcast enable; 1= respond     */
            unsigned int srst    : 1;     /* reset pld                    */
            unsigned int iften   : 1;     /* input fifo data              */
            unsigned int eoren   : 1;     /* end of reception             */
            unsigned int eoten   : 1;     /* end of transmission          */
            unsigned int haen    : 1;     /* header available             */
            unsigned int ohfen   : 1;     /* output fifo half full        */
50          unsigned int ofeen   : 1;     /* output fifo empty            */
            unsigned int ien     : 1;     /* masks ift,ofe,ohf,eot,eor,ha */
            } shadwcn;
    /* -------------------------------------------------------------------- */
    /*       status register masks and definition                          */
    # define iwrd_mask            0xfc00
    # define eor_mask             0x76ff
    # define eot_mask             0xf7ff
    # define ha_mask              0xefff
    # define ohf_mask             0xdfff
60  # define ofe_mask             0x6fff
    # define los_mask             0x7fff
    struct sst { /* last 6 generate interrupts if unmasked in cn register  */
            unsigned int if_wrd_cnt : 10; /* input fifo byte count        */
```

```
                unsigned int eot    : 1;     /* end of transmission (source) */
                unsigned int ha     : 1;     /* header available             */
                unsigned int ohf    : 1;     /* output fifo half full        */
                unsigned int ofe    : 1;     /* output fifo empty            */
                unsigned int los    : 1;     /* loss of sync (hdwe failure)  */
        } shadwst;
/* ---------------------------------------------------------------- */
/*      npi register masks and definition                           */
# define nio_select          0xfffe
# define sio_select          0xfffd
# define eio_select          0xfffb
# define wio_select          0xfff7
# define src_if_mask         0xffcf          /* 2 bits */
# define if_enabled_mask     0xff6f
# define ift_lvl             0xff7f
# define nport_cmask         0xfcff          /* 2 bits */
# define sport_cmask         0xf3ff          /* 2 bits */
# define eport_cmask         0xcfff          /* 2 bits */
# define wport_cmask         0x3fff          /* 2 bits */
struct snpi16 {                              /* npi control register        */
        unsigned int nio : 1;   /* 1st 4 define port as input/output  */
        unsigned int sio : 1;                /* 0 = input                  */
        unsigned int eio : 1;                /* 1 = output                 */
        unsigned int wio : 1;
        unsigned int src_if : 2;             /* 00(n), 01(s), 10(e), 11(w) */
        unsigned int mask_src_if : 1;        /* if 0, ingore value in src_if */
        unsigned int ift_level    : 1;       /* if 1, ift when if is 1/2 full */
                                             /* if 0, when 1/more bytes    */
        /* if port is output, port # is port connected to as source      */
        /*    if 11, output/headers are source to output                  */
        /* selection ignored if port is sourced to input/header fifos    */
        unsigned int n_npconfig   : 2;       /* 00(s), 01(e), 10(w), 11(o/hf) */
        unsigned int s_npconfig   : 2;       /* 00(n), 01(e), 10(w), 11(o/hf) */
        unsigned int e_npconfig   : 2;       /* 00(n), 01(s), 10(w), 11(o/hf) */
        unsigned int w_npconfig   : 2;       /* 00(n), 01(s), 10(e), 11(o/hf) */
        } shadwnp;
struct snpi24{                /* 32-bit npi register for 24-bit writes to ofen */
        struct snpi16 tmpl6;
        unsigned int npi24_unused1 : 7;
        unsigned int ofen          : 1;
        unsigned int npi24_unused2 : 8;
        } snpi;
/* ---------------------------------------------------------------- */
/*      nsi register masks and definition                           */
# define npn_active          0xefff
# define nps_active          0xdfff
# define npe_active          0x6fff
# define npw_active          0x7fff
struct snsi {                 /* nsi (and npi mask ) control register */
        unsigned int nsi_unused : 12;
        unsigned int n_np_unused : 1;        /* if the bit is set to one,   */
        unsigned int s_np_unused : 1;        /* ignore npi control register */
        unsigned int e_np_unused : 1;        /* settings for that particular */
        unsigned int w_np_unused : 1;        /* port                        */
        } shadwns;
/* ---------------------------------------------------------------- */
char dest_id;     /* for ease of use, define id as 8 bits, actually 7 */
struct shf {                                 /* header fifo (not actually a fifo) */
                                             /* need structure to create a 24-bit */
        char src_id;                         /* write of upper 8 bits of hf to set */
        short int nothing1;                  /* the HV bit                         */
        } shadwhf;
struct shf2{            /* 24-bit ints are stored as 32 bits by DSP32C */
        struct shf;
        unsigned int hfi24_unused1 : 7;
        unsigned int shf_sign      : 1;
```

```
/* ------------------------------------------------------------------ */
union { unsigned int actual; unsigned char shdreg[2]; struct sst tmpst; }addr, cpy, treg;

/* ------------------------------------------------------------------ */
/* beginning subroutine will be loaded at address 0x0                 */
/* ------------------------------------------------------------------ */
beginning()
{                          /* put PLD into 3 wait state mode */
asm("r2 = 9");
asm("pcw = r2");
                           /* initialize command queue pointers */
next_slotptr = &mq[0].subrtn;
fill_slotptr = &mq[0].subrtn;
asm("r22e = *irql_identifier"); /* addr of start of interrupt vector table */
}
/* ------------------------------------------------------------------ */
/*                                                    NODE INACTIVE   */
/* executed when no commands have been received yet, or               */
/* are in the middle of program execution and command queue empties   */
/* ------------------------------------------------------------------ */
node_wait()

wait_loop:
        active = 0;
        if (mq[next_slot].subrtn = 0x0)        /* no commands in queue */
            {
            if (user_wait_pgm != 0x0)
                    (*user_wait_pgm) ();
            else
                goto wait_loop;
            }
        else
            {
            activate_node();
            (*tmpfunc) ();                      /* execute next command */
            }
}
/* ------------------------------------------------------------------ */
/*                                                    ACTIVATE NODE   */
/* read command from queue, reinitialize slot, increment slot pointer */
/* ------------------------------------------------------------------ */
activate_node()
{
void *tmp1;
        active = 1;                             /* there is another command in queue */
        tmp1 = next_slotptr->subrtn;  /* copy address of subroutine to be */
                                      /*     executed to tmp1 - will not */
        tmpfunc = tmp1;               /* compile if copy directly to tmpfunc */
        cmd_param1 = next_slotptr->param1;
        cmd_param2 = next_slotptr->param2;
        cmd_param3 = next_slotptr->param3;  /* copy all parameters to */
        cmd_param4 = next_slotptr->param4;  /* variables user can access */
        /* ------------------------------ reinitialize command queue slot */
        next_slotptr->subrtn = 0x0;
        next_slotptr->param1 = 0x0;
        next_slotptr->param2 = 0x0;
        next_slotptr->param3 = 0x0;
        next_slotptr->param4 = 0x0;
        /* ------------------------------ increment next slot pointer */
        if (next_slot == MAX_SLOTS)
            {
            next_slot = 0;
            next_slotptr = &mq[0].subrtn;
            }
```

```
              /* next_slot++; */
        next_slotptr = &mq[++next_slot].subrtn;
    }
    /* ------------------------------------------------------------- */
    /*                                  Special Processing Functions  */
    /* Move parameters to work area and reinitialize all variables in */
    /* the command queue receival slot                                */
    /* ------------------------------------------------------------- */
    spmcslot()
    {
        sparam1 = new_param1;
        sparam2 = new_param2;
        sparam3 = new_param3;
        sparam4 = new_param4;
        /* ----------------- reinitialize receival slot variables */
        new_subrtn = 0x0;
        new_param1 = 0x0;
        new_param2 = 0x0;
        new_param3 = 0x0;
        new_param4 = 0x0;
    }
    /* ------------------------------------------------------------- */
    /*                   INTREQ2 Interrupt Identification Program    */
    /* interrupts available:                                         */
    /*     loss of sync - if use default sw, can identify whether error */
    /*                    occured while reading input/writing output fifo */
    /*                    error 20 - unidentifiable error            */
    /*                          21 - input fifo error                */
    /*                          22 - output fifo error               */
    /*     software interrupt - next command received from RTH       */
    /*     software interrupt placed first so that if you receive another */
    /*             command while in another interrupt handler, it's  */
    /*             processed immediately                             */
    /* ------------------------------------------------------------- */
    i2ident()
    {
        maskint();
        if (new_subrtn != 0x0)
            swint();
        else
        if ( (shadowst & los_mask) == 1)       /* if (shadwst.los)    */
        {
            if (wfif)         /* error while reading from input fifo */
            {
                hdwe_errcode = 21;         /* store error code        */
                asm("r1 = 0x15");          /* write err # to reg.     */
                asm("pir = r1");           /* write parallel int. reg. */
            }                              /* can only write pir from reg.*/
            else
            if (wtof)         /* error while writing to output fifo  */
            {
                hdwe_errcode = 22;
                asm("r1 = 0x16");          /* write err # to reg.     */
                asm("pir = r1");           /* write parallel int. reg. */
            }                              /* can only write pir from reg.*/
            else
            {                              /* unable to identify error */
                hdwe_errcode = 20;         /* store error code        */
                asm("r1 = 0x14");          /* write err # to reg.     */
                asm("pir = r1");           /* write parallel int. reg. */
            }                              /* can only write pir from reg.*/
        }
        clearint();
        asm("ireturn");
```

```
/*                                                    INTREQ2 Software Interrupt (SI) Handler  */
/* ------------------------------------------------------------------------------------------- */
 .swint ()                                  /* software interrupt handler */
 {
   void *tmp2;
      if (! active)
          active = 1;                       /* if was inactive, activate it */ if ( (new_subrtn == suspend_cmd)       ||
           (new_subrtn == prnt_suspend_cmd) )
                 suspended = 1;
      else
      if (new_subrtn == halt_cmd)
                 halted = 1;
      else
      if (new_subrtn == user_sp_pgm)
                 {
                 usersp = 1;
                 tmp2 = user_sp_pgm;
                 tmpfunc = tmp2;
                 spmcslot();
                 (*tmpfunc) ();
                 }
      else
      if (fill_slotptr->subrtn = 0x0)       /* next slot is empty */
            {                                /* fill next command queue slot */
            fill_slotptr->subrtn = new_subrtn;
            fill_slotptr->param1 = new_param1;
            fill_slotptr->param2 = new_param2;
            fill_slotptr->param3 = new_param3;
            fill_slotptr->param4 = new_param4;
            if (fill_slot == MAX_SLOTS)     /* increment next slot pointer */
                {
                fill_slot = 0;
                fill_slotptr = &mq[0].subrtn;
                }
            else
                {
                /* fill_slot++;  */
                fill_slotptr = &mq[++fill_slot].subrtn;
                } new_subrtn = 0x0;               /* reinitialize receival slot */
            new_param1 = 0x0;
            new_param2 = 0x0;
            new_param3 = 0x0;
            new_param4 = 0x0;
            }
      else
            {   /* ------------------------- queue full, fatal error */
            asm("r1 = 0x18");              /* write 24 to scratch register */
            asm("pir = r1");               /* write 24 to parallel interrupt register */
                                           /* to generate an interrupt to the RTH */
si_loop:                                   /* fatal error, wait here for RTH to do something */
            goto si_loop;
            } while (suspended)
            {
            if (new_subrtn != 0x0)
                {
                tmp2 = new_subrtn;
                tmpfunc = tmp2;
                /* ------------------------ move parameters, reinitialize slot */
                spmcslot();
```

- 22 -

```
            (*tmpfunc) ();
            }
        }
    while (halted)
        {
        ; /* do nothing - all memory locations remain exactly as they were */
          /* when the halt command was issued */
        }
    }
/* --------------------------------------------------------------------- */
/*                  INTREQ1 Interrupt Identification Program             */
/*  interrupts available:           ( occurs at )                        */
/*          eor     end of receiption (destination node)                 */
/*          eot     end of transmission (source node)                    */
/*          ha      header available (destination node)                  */
/*          ohf     output fifo half full (source node)                  */
/*          ofe     output fifo empty (source node)                      */
/*          ift     input fifo threshold                                 */
/*  errors which may be generated:                                       */
/*                  error 30 - unidentifiable interrupt                  */
/*                        31 - ohf timeout                               */
/* --------------------------------------------------------------------- */
 lident ()

short int errcode;
void *tmp3;
    maskint();
                            /*     if (shadwst.eor && shadwcn.eoren) */
    if (( (shadowst & eor_mask) == 1) && ( (shadowcn & eoren_mask) == 1))
            {               /* call eor interrupt handler */
            tmp3 = eor_handler;
            tmpfunc = tmp3;
            (*tmpfunc) ();
            }
    else
                            /* if (shadwst.eot && shadwcn.eoten) */
    if (( (shadowst & eot_mask) == 1) && ( (shadowcn & eoten_mask) == 1))
            {               /* call eot interrupt handler */
            tmp3 = eot_handler;
            tmpfunc = tmp3;
            (*tmpfunc) ();
            }
    else
                            /* if (shadwst.ha && shadwcn.haen) */
    if (( (shadowst & ha_mask) == 1) && ( (shadowcn & haen_mask) == 1))
            {               /* call ha interrupt handler */
            tmp3 = ha_handler;
            tmpfunc = tmp3;
            (*tmpfunc) ();
            }
    else
                            /* if (shadwst.ohf && shadwcn.ohfen) */
    if (( (shadowst & ohf_mask) == 1) && ( (shadowcn & ohfen_mask) == 1))
            {               /* call ohf interrupt handler */
            tmp3 = ohf_handler;
            tmpfunc = tmp3;
            (*tmpfunc) ();
            }
    else
                            /* if (shadwst.ofe && shadwcn.ofeen) */
    if (( (shadowst & ofe_mask) == 1) && ( (shadowcn & ofeen_mask) == 1)
            {               /* call ofe interrupt handler */
            tmp3 = ofe_handler;
            tmpfunc = tmp3;
            (*tmpfunc) ();
            }
```

```
            else
                                /* if (if cnt > 0 && shadwcn.iften) */
            if (( (shadowst & iwrd_mask) > 0) && ( (shadowcn & iften_mask) == 1))
                {                       /* call ift interrupt handler */
                tmp3 = ift_handler;
                tmpfunc = tmp3;
                (*tmpfunc) ();
                }
            else
                {                               /* unidentifiable interrupt */
                asm("r1 = 0x1E");               /* write err # to reg. */
                asm("pir = r1");                /* write 30 to parallel int. reg. */
                }                               /* can only write pir from reg.*/
        clearint();
    asm("ireturn");
    }
/* --------------------------------------------------------------- */
/*                                     EOT default Interrupt Handler   */
/*   if eot & ofe, clear ofen    (release xpa)                         */
/* --------------------------------------------------------------- */
def_eot_handler()
                                /* st register copied to shadowst in maskint */
    register int *rt1;
    register int *rt2;
    register int rt3;
    register int *rt4;

end_of_trans = 1;               /* set this for mult. hdr only sends */
    if ( (shadowst & ofe_mask) == 1)
        {
        rt4 = np;                   /* load np reg. addr. into register */
        output_fifo_empty = 1;
        rt3 = shadownp;             /* load contents of shadownp into register */
        rt4 = rt3;                  /* 16 bit write to np to clear OFEN */
        }
    /* ------------------------------- clear interrupt */
    rt1 = st;                       /* rt1 = address of st register */
    rt2 = &shadowst;                /* rt2 = address of shadow copy of st register */
    shadowst = shadowst^eot_mask;   /* clear eot interrupt */
    *rt1 = *rt2;                    /* st = shadowst */
    }
/* --------------------------------------------------------------- */
/*                                     EOR default Interrupt Handler   */
/* --------------------------------------------------------------- */
def_eor_handler()
                                /* st register copied to shadowst in maskint */
    register int *rt1;
    register int *rt2;
        end_of_data = 1;
        if_bytes_left = shadwst.if_wrd_cnt;   /* get # bytes left to read */
    /* ------------------------------- clear interrupt */
    rt1 = st;                       /* rt1 = address of cn register */
    rt2 = &shadwst;                 /* rt2 = address of shadow copy of st register */
    shadowst = shadowst^eor_mask;   /* clear eor interrupt */
    *rt1 = *rt2;                    /* st = shadowst */
    }
/* --------------------------------------------------------------- */
/*                                     HA default Interrupt Handler    */
/* --------------------------------------------------------------- */
def_ha_handler()
    {
    register int *rt1;
    register int rt2;
        rt1 = cn;                           /* rt1 = address of cn register */
        shadowcn = shadowcn+haen_mask;      /* set ha mask - mask ha interrupt */
```

```
        rt2 = shadowcn;            /* know haen wasn't 0 before because got interrupt */
        *rt1 = rt2;                /* rt2 = shadow copy of cn register */
    }                              /* cn = shadowcn */
/* -------------------------------------------------------------------- */
/*                                              OFE default Interrupt Handler   */
/* -------------------------------------------------------------------- */
def_ofe_handler()
{                                  /* st register copied to shadowst in maskint */
    register int *rt1;
    register int *rt2;
    /* --------------------------------- clear interrupt */
    rt1 = st;                      /* rt1 = address of cn register */
    rt2 = &shadwst;                /* rt2 = address of shadow copy of st register */
    shadowst = shadowst^ofe_mask;  /* clear ofe interrupt */
    *rt1 = *rt2;                   /* st = shadowst - can do MEM-MEM */
}                                  /* write only in C code */
/* -------------------------------------------------------------------- */
/*                                              IFT default Interrupt Handler   */
/* -------------------------------------------------------------------- */
def_ift_handler()
{                                  /* st register copied to shadowst in maskint */
    register int *rt1;
    register int *rt2;
    register int rt3;
    /* --------------------------------- clear eor interrupt - need eor to */
                                   /* get final if byte count */
    shadowst = shadowst^eor_mask;  /* clear eor interrupt */
    rt1 = st;                      /* rt1 = address of st register */
    rt2 = &shadwst;                /* rt2 = address of shadow copy of st register */
                                   /* *rt2 = *rt1; copy st register to shadow copy */
    rt3 = *rt2;                    /* copy shadow copy to register */
    *rt1 = rt3;                    /* st = shadowst */ if_bytes_left = shadwst.if_wrd_cnt;  /* get # bytes left to read */
    bytes_recd = 0;
    movein();                      /* move data from if to memory */
}
/* -------------------------------------------------------------------- */
/*                                        Mask all INTREQ1 Interrupts   */
/* ien = 1 upon entry to this subroutine                                */
/* if ien = 0 interrupts will be masked                                 */
/* -------------------------------------------------------------------- */
maskint()
{
    register int *rt1;
    register int rt2;
    register int *rt3;
        rt1 = cn;                  /* rt1 = address of cn register */
        shadowcn = shadowcn^srset_ien;  /* clear ien-mask all INT1 interrupts */
        rt2 = shadowcn;            /* rt2 = shadow copy of cn register */
        rt3 = shadowst;            /* rt3 = shadow copy of st register */
        *rt1 = rt2;                /* cn = shadowcn */ rt1 = st;                  /* rt1 = address of st register */
        *rt3 = *rt1;               /* copy st register to shadow copy */
        addr.actual = shadowst;    /* copy int shadow copy to union */
        shadwst = creg.tmpst;      /* copy union to struct */
}
/* -------------------------------------------------------------------- */
/*                                        Unmask INTREQ1 Interrupts     */
/* ien = 0 upon entry to this subroutine                                */
/* if ien = 1 interrupts will be generated                              */
/* -------------------------------------------------------------------- */
clearint()
```

```
register int *rt1;
register int *rt2;
    rt1 = cn;                              /* rt1 = address of cn register */
    shadowcn = shadowcn^srset_ien;         /* set ien-unmask all INT1 interrupts */
    rt2 = &shadowcn;                       /* rt2 = address of shadow copy of cn register */
    *rt1 = *rt2;                           /* cn = shadowcn */
}
/* ---------------------------------------------------------------------- */
/*                          MOVEIN Subroutine                             */
/* This subroutine moves data from the input FIFO to a memory location,   */
/*      the address of which is stored in the variable STOREat            */
/*                                                                        */
/* NOTE: This subroutine will not work for 24-bit integers                */
/*                                                                        */
/* Because input FIFO is only 8 bits, always reading the "l" part of      */
/*      an int or float from the fifo                                     */
/*                                                                        */
/* Take snapshot of byte count when ift occurs. Decrement that count      */
/*      to 0; if not eor, there's still more bytes to copy. Take          */
/*      another snapshot of byte count and decrement. Do this until       */
/*      eor (end_of_data == 1)                                            */
/* ---------------------------------------------------------------------- */
movein()
{
register int mc1;
register int *rt1;
register int *rt2;
wfif = 1;
asm("r1e = ififo");                /* r1 = addr of input fifo */
asm("r3e = STOREat");              /* r3 = addr to store data at */
keep_reading:
    mc1 = if_bytes_left;                   /* load #bytes to move into register */
    bytes_recd = bytes_recd+if_bytes_left; /* sum total #bytes in packet */
    while ( mc1 > 0 )
    {
        asm("r21 = *r1");          /* r21 = 8 lsb of 16 bit data */
        asm("3*nop");              /* pld regs. are 3 wait state */
        asm("*r3 = r21");          /* move data to memory */
        asm("3*nop");              /* pld regs. are 3 wait state */
        asm("r3 = r3+1");          /* incr. ptr to next 8 bit memory location */
        mc1 = mc1 - 1;             /* decr. count of bytes to mov. */
    }
    if (! end_of_data)             /* end of data when get eor interrupt */
    {
        rt1 = st;                              /* rt1 = address of st register */
                        /* *rt2 = *rt1: copy st register to shadow copy */
        shadowst = *rt1;                       /* copy st register to shadow copy */
        addr.actual = shadowst;                /* copy int shadow copy to union */
        shadwst = creg.tmpst;                  /* copy union to struct */
        if_bytes_left = shadwst.if_wrd_cnt;    /* get # bytes left to read */
        goto keep_reading;
    } end_of_data = 0;                           /* clear end_of_data */
wfif = 0;
}
/* ---------------------------------------------------------------------- */
/*                          MOVEI24 Subroutine                            */
/* This subroutine moves 24 bit integers from the input FIFO to a         */
/*      memory location, the address of which is stored in the            */
/*      variable STOREat                                                  */
/*                                                                        */
/* NOTE: This subroutine will not work for 16 or 32-bit data              */
/*                                                                        */
/* Because input FIFO is only 8 bits, always reading the "l" part of      */
```

```
/*           an int from the fifo,                                          */
/* 24-bit data actually allocated 32 bits in memory. After reading          */
/*      last 8 bits of data, must increment pointer 2 bytes to point        */
/*      to starting address of next 24-bit integer                          */
/*                                                                          */
/* Take snapshot of byte count when ift occurs. Decrement that count        */
/*      to 0; if not eor, there's still more bytes to copy. Take            */
/*      another snapshot of byte count and decrement. Do this until         */
/*      eor (end_of_data == 1)                                              */
/* ------------------------------------------------------------------------ */
movei24()
{
register int mc1;
register int *rt1;
register int *rt2;
wfif = 1;
asm("r1e = ififo");           /* r1 = addr of input fifo */
asm("r3e = STOREat");         /* r3 = addr to store data at */
read_i24:
    mc1 = if_bytes_left;                /* load #bytes to move into register */
    bytes_recd = bytes_recd+if_bytes_left;    /* sum total #bytes in packet */
    while ( mc1 > 0)
        {
        asm("r21 = *r1");     /* r21 = 8 lsb of 24 bit data */
        asm("3*nop");         /* pld regs. are 3 wait state */
        asm("*r3 = r21");     /* move data to memory */
        asm("3*nop");         /* pld regs. are 3 wait state */
        asm("r3 = r3+1");     /* incr. ptr to next 8 bit memory location */
        asm("r21 = *r1");     /* r21 = next 8 bits of 24 bit data */
        asm("3*nop");         /* pld regs. are 3 wait state */
        asm("*r3 = r21");     /* move data to memory */
        asm("3*nop");         /* pld regs. are 3 wait state */
        asm("r3 = r3+1");     /* incr. ptr to next 8 bit memory location */
        asm("r21 = *r1");     /* r21 = 8 msb of 24 bit data */
        asm("3*nop");         /* pld regs. are 3 wait state */
        asm("*r3 = r21");     /* move data to memory */
        asm("3*nop");         /* pld regs. are 3 wait state */
        asm("r3 = r3+2");     /* incr. ptr to next 24 bit memory location */
        mc1 = mc1 - 3;        /* decr. count - move 3 8-bit quantities */
        } if (! end_of_data)        /* end of data when get eor interrupt */
        {
        rt1 = st;             /* rt1 = address of st register */
                    /* *rt2 = *rt1; copy st register to shadow copy */
        shadowst = *rt1;      /* copy st register to shadow copy */
        addr.actual = shadowst;  /* copy int shadow copy to union */
        shadwst = creg.tmpst; /* copy union to struct */
        if_bytes_left = shadwst.if_wrd_cnt;  /* get # bytes left to read */
        goto read_i24;
        } end_of_data = 0;              /* clear end_of_data */
wfif = 0;
}

/* ------------------------------------------------------------------------ */
/*                          SENDPKTI Subroutine                             */
/* This subroutine calculates the number of 8-bit data transfers are        */
/*      required for 16 bit integers and calls sendpkt                      */
/* ------------------------------------------------------------------------ */
sendpkti(dest,mem,bites)
char dest;
int mem, bites;
{
        bites = bites * 2;
```

```
                sendpkt(dest,mem,bites);
        }
        /* -------------------------------------------------------------- */
        /*                         SENDPKTF Subroutine                    */
        /* This subroutine calculates the number of 8-bit data transfers are */
        /*      required for 32 bit floats and calls sendpkt              */
        /* -------------------------------------------------------------- */
        sendpktf(dest,mem,bites)
        char dest;
        int mem, bites;
        {
                bites = bites * 4;
                sendpkt(dest,mem,bites);
        }
        /* -------------------------------------------------------------- */
        /*                         SENDPKT Subroutine                     */
        /* This subroutine creates and loads a "data plus header packet into */
        /*      the output FIFO                                           */
        /* Output FIFO must be empty before loading next data packet - if it */
        /*      is not empty, return error code 14 to application program */
        /* -------------------------------------------------------------- */
        sendpkt(dest,mem,bites)
        char dest;
        int mem, bites;
        {
        int tmpctr;
        wtof = 1;

asm("r1e = st");             /* r1 = addr of st register */
            asm("r2 = *r1");             /* copy st reg. to dsp32 reg. */
            asm("3*nop");                /*   pld regs. are 3 wait state */
            asm("*shadowst = r2");       /* copy st reg. to shadowst */
            if ( (shadowst & ofe_mask) != 1)  /* ofifo not empty - error */
                return(14);

output_fifo_empty = 0;       /* set flag for loading data to of */
            end_of_trans = 0;            /* set flag - not end of trans */ asm("r1e = ofifo");          /* r1 = addr of output fifo */
            asm("r3e = STOREat");        /* r3 = addr to move data from */
            asm("r4e = hf");             /* r4 = addr of header fifo */
            asm("r15e = np");            /* r15 = addr of np register */
            shpi.tmp16 = shadwnp;
            asm("r16e = npi24");         /* r16 = 24 bit np reg. */
            dest_id = dest;              /* fill dest id (debugging?) */
            shadwhf.src_id = ID;         /* create header - fill src id */ if (bites < 512)
                {
                /* ---------------------- write all data except last 8 bits */
                /* ---------------------- write last 8 bits as 24 bits to set EOM */
                /* ---------------------- write hf & np to start data transmission */
                for (tmpctr = 0; tmpctr++ < bites-1;)
                    {
                                         /* write all but last byte to of */
                        asm("r21 = *r3");    /* r21 = 8 bits of data */
                        asm("3*nop");        /* pld regs. are 3 wait state */
                        asm("*r1 = r21");    /* move data to output fifo */
                        asm("r3 = r3+1");    /* incr. ptr to next 8 bit memory */
                    }                        /* location */
                asm("r21 = *r3");    /* r21 = last byte of data */
                asm("*r1 = r3e");    /* 24 bit write to ofifo to set eom bit */
                asm("r17 = *dest");  /* write lsb to register */
                asm("3*nop");        /* pld regs. are 3 wait state */
                asm("*r4 = r17");    /* write lsb to hfifo */
                asm("3*nop");        /* pld regs. are 3 wait state */
                asm("r17 = *shadwhf"); /* 24-bit write msb to register */
```

```
            asm("3*nop");           /* pld regs. are 3 wait state */
            asm("*r4 = r17e");      /* 24-bit write msb to hfifo to set HV bit */
            asm("*r15 = r16e");     /* 24-bit write to np to activitate of XPA */
        }
    else
        {
            /* ------------------- write chunk of 8 bit data to of        */
            /* ------------------- write hf & np to start data transmission */
            /* ------------------- write rest of data except last 8 bits */
            /* ------------------- write last 8 bits as 24 bits to set EOM */
            for (tmpctr = 0; tmpctr++ < 512;)
                {                           /* write data to half the of */
                    asm("r21 = *r3");       /* r21 = 8 bits of data */
                    asm("3*nop");           /* pld regs. are 3 wait state */
                    asm("*r1 = r21");       /* move data to output fifo */
                    asm("*r3 = r3+1");      /* incr. ptr to next 8 bit memory */
                }                           /* location */
            asm("r17 = *dest");       /* write lsb to register */
            asm("3*nop");             /* pld regs. are 3 wait state */
            asm("*r4 = r17");         /* write lsb to hfifo */
            asm("3*nop");             /* pld regs. are 3 wait state */
            asm("r17e = *shadwhf");   /* 24-bit write msb to register */
            asm("3*nop");             /* pld regs. are 3 wait state */
            asm("*r4 = r17e");        /* 24-bit write msb to hfifo to set HV bit */
            asm("*r15 = r16e");       /* 24-bit write to np to activitate of XPA */
            for (; tmpctr++ < bites-1;)
                {                           /* write data to half the of */
                    asm("r21 = *r3");       /* r21 = 8 bits of data */
                    asm("3*nop");           /* pld regs. are 3 wait state */
                    asm("*r1 = r21");       /* move data to output fifo */
                    asm("*r3 = r3+1");      /* incr. ptr to next 8 bit memory */
                }
            asm("r21 = *r3");         /* r21 = last byte of data */
            asm("*r1 = r3e");         /* 24 bit write to ofifo to set eom bit */
        }
    wtof = 0;
    }
/* ------------------------------------------ INTERRUPT VECTOR TABLE -------- */
/* list of gotos of the default interrupt handlers - the order is mandatory! */
/* The following cannot be altered by application programmers               */
/*      ilident - INTREQ2 interrupt identification program                  */
/*      i2ident - INTREQ1 interrupt identification program                  */
/* -------------------------------------------------------------- */
/* ------------------- external interrupt 1 */
asm("goto ilident");
asm("nop");
/* ------------------- PIO buffer full */
asm("goto pio_full");
asm("nop");
/* ------------------- PIO buffer empty */
asm("goto pio_empty");
asm("nop");
/* ------------------- SIO input buffer full */
asm("goto sio_full");
asm("nop");
/* ------------------- SIO output buffer empty */
asm("goto sio_empty");
asm("nop");
/* ------------------- external interrupt 2 */
asm("goto i2ident");
asm("nop");
/* ------------------- dsp32C reserved 1 */
asm("goto dsp3res1");
asm("nop");
/* ------------------- dsp32C reserved 2 */
asm("goto dsp3res2");
```

```
.  asm("nop");
   /* ----------------------------------------  end INTERRUPT VECTOR TABLE -------- */
   pio_full()
   {
        asm("ireturn");
   }
   pio_empty()
   {
        asm("ireturn");
   }
   sio_full()
   {
        asm("ireturn");
   }
   sio_empty()
   {
        asm("ireturn");
   }
   /* should never get to dsp3res1 or dsp3res2 - these will be fatal errors */
   /*    and assigned error codes to generate (in addition to ireturn)     */
   dsp3res1()
   {
        asm("ireturn");
   } dsp3res2()
   {
        asm("ireturn");
   }
```

We claim:

1. A process for embedding a desired tree node topology in an assembly of processing elements fixedly interconnected through controllably enabled element ports, comprising the steps of:
   defining a desired tree node interconnection topology,
   determining a processor element port-to-port connection arrangement for the given said assembly which maximizes use of processors known to be operable,
   modifying said port-to-port connection arrangement to minimize tree depth, and
   embedding said modified processor element connection arrangement into said assembly of elements by enabling selected ones of said processor element ports.

2. A process pursuant to claim 1, comprising the further steps of:
   monitoring the run performance of said operating processor elements to detect elements which become inoperable, and
   re-modifying said port-to-port connection arrangements to minimize tree depth and to make maximum use of remaining operable said processor elements.

3. A process for synthesizing a desired node interconnection topology in an assembly of processing elements under control of a Host, in which
   each element comprises plural signal communication ports,
   said elements are physically arrayed in x-y matrices on one or more mounting means,
   each element of each said matrix other than elements located at the matrix corners is interconnected to four neighbor PEs,
   each corner element is connected to its respective two neighbor elements and has two external connection paths, and
   said assembly comprises means for effecting signal routing within each element between its said processing capability and any of said plural ports, said process comprising:
   defining in said Host a desired processor element intra-board port interconnection topology for each board,
   testing under Host control said elements for faults,
   determining in said Host alternate processor element port interconnections which route signals around elements identified as faulted; and
   reconfiguring selected ones of said ports based on said alternate processor element port interconnections.

4. The process of claim 3, wherein said desired topology is a tree, and said process comprises the further step of:
   determining in said Host the minimum depth of tree leafs in said matrix, using the available unfaulted processor elements and communications paths.

5. A process pursuant to claims 2 or 4, comprising the further steps of: operating said enabled ports to serve as parent/child or child/parent paths.

6. Apparatus for expanding a tree multiprocessor topology while maintaining a constant number of root connection paths to said topology, and a constant number of expansion nodes, comprising:
   first and second arrays of substantially identical processor elements, each element having plural ports,
   means for selectively connecting ports of adjacent ones of all but two of said elements in each said array, to form in each array a two-root subtree of processor elements,
   said two elements not used in said subtrees each comprising three-port expansion nodes,
   said two roots and said three-port expansion nodes thereby furnishing eight connection paths to each said array,
   means for connecting the subtree and a first expansion node in said first array to the corresponding parts of said second array, thereby forming a further two-root subtree, the second said expansion node of each said array being available to replace elements in its respective array, and said two roots of said further subtree and said last-named nodes thereby comprising a total of eight connection paths to the combined assemblages of said first and said second processor element arrays.

7. Apparatus in accordance with claim 6, wherein each said processor element comprises four ports.

8. Apparatus in accordance with claim 7, wherein said first and second arrays of processor elements comprise elements disposed in an X-Y matrix, with respective processor elements connected to their immediate neighbors.

9. In a system for performing concurrent computational processes in a controlled assembly of processing elements interconnected as processing nodes, means for embedding a desired topology of nodes into a fixed lattice, comprising:

a remote command Host, a plurality of processor elements arrayed in one or more matrices of nodes, each said element having plural exterior ports accessing the processing capability of said element, and means for effecting signal routing within each said processor element between its said processing capability and any of said plural ports, and for blocking signal routing at selected ports, means for connecting selected ports of the elements in each said matrix to selected ports of neighbor elements, and for connecting selected ports of designated elements either to selected element ports in a further matrix of processor elements or to said Host, and means in said Host for conditioning said element ports to direct signals to and from only selected ones each element's neighboring processor elements, said conditioning means achieving a desired interconnection topology for the nodes of said system.

10. In a system for performing concurrent computational processes in an assembly of processing elements fixedly interconnected as processing nodes, means for synthesizing a desired node interconnection topology comprising:

a remote command Host, a plurality of processor elements arrayed in one or more rectangular matrices of nodes, each said element having four exterior ports accessing the processing capability of said element, means for defining a desired node interconnection topology, means for detecting inoperative processor elements, means for determining a processor element port-to-port connection arrangement for the given said assembly which maximizes use of processor elements found to be operating, and means in each said element under control of said Host for enabling signal routing within said operating processor elements between their said processing capability and any of their said four ports, and for blocking signal routing at selected ports.

11. A system in accordance with claim 10, wherein said desired topology is a tree, and said system further comprises:

means for modifying said port-to-port connection arrangement to minimize tree depth.

12. A system in accordance with claim 11, wherein said enabling means further comprises:

means responsive to indicia of the location in said matrices of detected inoperative processor elements for reconfiguring said port-to-port connection arrangement to utilize only operating ones of said elements.

13. A system pursuant to claim 12, further comprising:

means for connecting selected ports of said elements to selected processor element ports in a further matrix of processor elements or to said Host.

14. Apparatus in accordance with claim 12, further comprising;

means for orienting selected ones of said ports of each said element, to serve as parent/child or child/parent paths.

* * * * *

UNITED STATES PATENT AND TRADEMARK OFFICE
CERTIFICATE OF CORRECTION

PATENT NO. : 5,020,059
DATED : May 28, 1991
INVENTOR(S) : A. L. Gorin, et al

It is certified that error appears in the above—identified patent and that said Letters Patent is hereby corrected as shown below:

Column 1, Line 59 - change "scale," to --scale--.

Column 2, Line 3 - change "board- mounted" to --board-mounted--.

Column 3, Line 46 - change "detained" to --detail--.

Column 5, Line 27 - change "24b- ports" to --24b-ports--;

Column 5, Line 28 - change "25b- ports" to --25b-ports--;

Column 5, Line 32 - change "non-fault- tolerant" to --non-fault-tolerant--;

Column 5, Line 41 - change "two 8- port" to --two 8-port--.

Column 6, Line 22 - change "board- level" to --board-level--.

Column 9, Line 27 - change "west" to --and west--;

Column 9, Line 57 - change "N,S,E,W" to --N, S, E, W--.

Column 10, Line 8 - change "scribed," to --scribe--;

Column 10, Line 23 - change "Broadcast" to --BROADCAST--;

Column 10, Line 27 - change "74. To support" to --74 to support--;

Column 10, Line 37 - change "root PE - 1.1" to --root PE 1.1--,

Column 10, Line 37 - change "second level -PEs" to --second-level PEs--;

Column 10, Lines 37-8 - change "third level - PEs" to --third-level PEs--,

Column 10, Line 38 - change "fourth level - PEs" to --fourth-level PEs--;

Column 10, Line 39 - change "fifth level PE" to --fifth-level PE--.

Column 11, Line 37 - change "pe" to --PE--.

Column 12, Line 32 - change "BROADCAST RESOLVE and "REPORT"" to --"BROADCAST," "RESOLVE" and "REPORT"--.

UNITED STATES PATENT AND TRADEMARK OFFICE
CERTIFICATE OF CORRECTION

PATENT NO. : 5,020,059         Page 2 of 3

DATED : May 28, 1991

INVENTOR(S) : A.L. Gorin, et al

It is certified that error appears in the above-identified patent and that said Letters Patent is hereby corrected as shown below:

Columns 33-34 - add:

```
/*      an int from the fifo.                                         */
/* 24-bit data actually allocated 32 bits in memory. After reading    */
/*    last 8 bits of data, must increment pointer 2 bytes to point    */
/*    to starting address of next 24-bit integer                      */
/*                                                                    */
/* Take snapshot of byte count when ift occurs. Decrement that count  */
/*    to 0; if not eor, there's still more bytes to copy. Take        */
/*    another snapshot of byte count and decrement. Do this until     */
/*    eor (end_of_data == 1)                                          */
/* ---------------------------------------------------------------- */
move124()
{
    register int mc1;
    register int *rt1;
    register int *rt2;
    wfif = 1;
    asm("r1e = ififo");           /* r1 = addr of input fifo */
    asm("r3e = STOREat");         /* r3 = addr to store data at */ read_i24:
    mc1 = if_bytes_left;          /* load #bytes to move into register */
    bytes_recd = bytes_recd+if_bytes_left;  /* sum total #bytes in packet */
    while ( mc1 > 0)
    {
        asm("r21 = *r1");         /* r21 = 8 lsb of 24 bit data */
        asm("3*nop");             /* pld reqs. are 3 wait state */
        asm("*r3 = r21");         /* move data to memory        */
        asm("3*nop");             /* pld reqs. are 3 wait state */
        asm("r3 = r3+1");         /* incr. ptr to next 8 bit memory location */
        asm("r21 = *r1");         /* r21 = next 8 bits of 24 bit data */
        asm("3*nop");             /* pld reqs. are 3 wait state */
        asm("*r3 = r21");         /* move data to memory        */
        asm("3*nop");             /* pld reqs. are 3 wait state */
        asm("r3 = r3+1");         /* incr. ptr to next 8 bit memory location */
        asm("r21 = *r1");         /* r21 = 8 msb of 24 bit data */
        asm("3*nop");             /* pld reqs. are 3 wait state */
        asm("*r3 = r21");         /* move data to memory        */
        asm("3*nop");             /* pld reqs. are 3 wait state */
        asm("r3 = r3+2");         /* incr. ptr to next 24 bit memory location */
        mc1 = mc1 - 3;            /* decr. count - move 3 8-bit quantities */
    } if (! end_of_data)            /* end of data when get eor interrupt */
    {
        rt1 = st;                 /* rt1 = address of st register */
                /* *rt2 = *rt1; copy st register to shadow copy */
        shadowst = *rt1;          /* copy st register to shadow copy */
        addr.actual = shadowst;   /* copy int shadow copy to union */
        shadwst = creg.tmpst;     /* copy union to struct */
        if_bytes_left = shadwst.if_wrd_cnt;  /* get # bytes left to read */
        goto read_i24;
    }
}
```

UNITED STATES PATENT AND TRADEMARK OFFICE
CERTIFICATE OF CORRECTION

PATENT NO. : 5,020,059

DATED : May 28, 1991

INVENTOR(S) : A.L. Gorin, et al

It is certified that error appears in the above-identified patent and that said Letters Patent is hereby corrected as shown below:

Columns, 33-34 — add:

```
        end_of_data = 0;              /* clear end_of_data */
        wfif = 0;
        )
    /* ----------------------------------------------------------- */
    /*                          SENDPKTI Subroutine                */
60  /* This subroutine calculates the number of 8-bit data transfers are */
    /*       required for 16 bit integers and calls sendpkt       */
    /* ----------------------------------------------------------- */
    sendpkti(dest,mem,bites)
    char dest;
    int mem, bites;
    {
            bites = bites * 2;
```

Signed and Sealed this

Fourth Day of May, 1993

Attest:

MICHAEL K. KIRK

Attesting Officer

Acting Commissioner of Patents and Trademarks